(12) United States Patent
Keller

(10) Patent No.: US 11,886,885 B2
(45) Date of Patent: Jan. 30, 2024

(54) HIGH-THROUGHPUT ASYNCHRONOUS DATA PIPELINE

(71) Applicant: NVIDIA CORPORATION, Santa Clara, CA (US)

(72) Inventor: Benjamin Andrew Keller, Oakland, CA (US)

(73) Assignee: NVIDIA Corporation, Santa Clara, CA (US)

(*) Notice: Subject to any disclaimer, the term of this patent is extended or adjusted under 35 U.S.C. 154(b) by 87 days.

(21) Appl. No.: 17/480,728

(22) Filed: Sep. 21, 2021

(65) Prior Publication Data
US 2023/0047511 A1    Feb. 16, 2023

Related U.S. Application Data

(60) Provisional application No. 63/231,692, filed on Aug. 10, 2021.

(51) Int. Cl.
| | | |
|---|---|---|
| *G06F 9/38* | (2018.01) | |
| *G06F 5/16* | (2006.01) | |
| *G06F 13/16* | (2006.01) | |
| *G11C 7/10* | (2006.01) | |
| *H03K 19/20* | (2006.01) | |

(52) U.S. Cl.
CPC .............. *G06F 9/3869* (2013.01); *G06F 5/16* (2013.01); *G06F 13/1642* (2013.01); *G11C 7/1063* (2013.01); *H03K 19/20* (2013.01)

(58) Field of Classification Search
CPC ...... G06F 9/3869; G06F 5/16; G06F 13/1642; G11C 7/1063; H03K 19/20

USPC ............................ 710/20, 29, 33, 36
See application file for complete search history.

(56) References Cited

U.S. PATENT DOCUMENTS

| | | | | |
|---|---|---|---|---|
| 5,392,423 A | * | 2/1995 | Yetter | ............... G06F 9/3869 |
| | | | | 712/E9.063 |
| 5,434,520 A | * | 7/1995 | Yetter | ............... H03K 19/094 |
| | | | | 326/97 |

(Continued)

OTHER PUBLICATIONS

Singh et al., "Mousetrap: Designing High-Speed Asynchronous Digital Pipelines", 67 pages.

(Continued)

*Primary Examiner* — Idriss N Alrobaye
*Assistant Examiner* — Henry W Yu
(74) *Attorney, Agent, or Firm* — Artegis Law Group, LLP

(57) ABSTRACT

One embodiment of the present invention sets forth a data pipeline, which includes a first mousetrap element and a second mousetrap element in a first pipeline stage. Each mousetrap element includes a request latch that, when enabled, allows a request signal to pass from the first pipeline stage to a second pipeline stage following the first pipeline stage in the data pipeline. Each mousetrap element also includes a data latch that, when enabled, allows a data element to pass from the first pipeline stage to the second pipeline stage. Each mousetrap element further includes a latch controller that enables and disables the request and data latches based on a phase signal that alternates between a first value that configures the first mousetrap element to transmit data to the second pipeline stage and a second value that configures the second mousetrap element to transmit data to the second pipeline stage.

20 Claims, 13 Drawing Sheets

(56) References Cited

U.S. PATENT DOCUMENTS

| | | | | |
|---|---|---|---|---|
| 2004/0046590 A1* | 3/2004 | Singh | ................... | G06F 9/3871 |
| | | | | 712/E9.063 |
| 2007/0260857 A1* | 11/2007 | Bink | .................... | G06F 9/3867 |
| | | | | 712/E9.063 |
| 2011/0121857 A1* | 5/2011 | Nowick | ................ | H03K 19/20 |
| | | | | 326/54 |
| 2011/0169525 A1* | 7/2011 | Gill | .......................... | G06F 7/00 |
| | | | | 326/39 |

OTHER PUBLICATIONS

Singh et al., "Mousetrap: High-Speed Transition-Signaling Asynchronous Pipelines", IEEE Transactions on Very Large Scale Integration (VLSI) Systems, vol. 15, No. 6, Jun. 2007, 15 pages.

\* cited by examiner

HIGH-THROUGHPUT ASYNCHRONOUS DATA PIPELINE

CROSS-REFERENCE TO RELATED APPLICATIONS

This application claims benefit of the U.S. Provisional Patent Application titled "FULL-THROUGHPUT ASYNCHRONOUS PIPELINE," filed Aug. 10, 2021 and having Ser. No. 63/231,692. The subject matter of this related application is hereby incorporated herein by reference.

BACKGROUND

Field of the Various Embodiments

Embodiments of the present disclosure relate generally to computer and processor architecture and digital data pipelines and, more specifically, to a high-throughput asynchronous data pipeline.

Description of the Related Art

Digital data pipelines are commonly used to transport data elements within or across hardware elements in computing devices. For example, digital data pipelines could be used to transport data over long distances across a die or across intra-package links such as short-reach interposer channels, through-silicon vias (TSVs), or fine-grained face-to-face interfaces. Existing pipeline circuits for transporting data within computer systems and processors are generally source-synchronous, where the clock of a transmitter is forwarded along with the data. The data and clock signals are then synchronized upon arrival at a receiver, which may act on a clock period or phase that differs from that of the transmitter. However, synchronous pipelines incur certain costs when forwarding a clock signal with data.

More specifically, a synchronous pipeline typically includes a valid signal that indicates whether a transmitter has valid data to transport, a data bus having a width N over which the data is transmitted, and a ready signal in the direction opposite the data transmission that indicates whether a receiver is ready to receive the data from the transmitter. In addition, retiming stages that include registers for all of the various signals are inserted at intervals along the data bus such that the signals are able to traverse the distances between retiming stages within a single clock cycle. To maintain full throughput across the pipeline, each retiming stage also includes a skid buffer that provides a redundant set of data registers, which enables the data to advance within the pipeline at each clock cycle before the "ready" value from the next stage in the pipeline is known. Accordingly, the additional hardware and logic needed to implement a given retiming stage includes approximately 2N flip-flop elements, the associated multiplexer elements, and a certain amount of extra control logic. Each flip-flop element also imposes a timing delay on the pipeline arising from the setup and hold time required to accurately capture data at the input of the flip-flop element.

To reduce the overhead attributable to synchronous pipelines, a synchronous pipeline can be replaced with an asynchronous pipeline that does not have any type of global timing controller. In an asynchronous pipeline, a current stage in the pipeline transmits control signals to a previous stage in the pipeline to trigger the transmission of data from the previous stage to the current stage without the use of a global clock. Because data is transmitted across stages in the pipeline without a global clock, asynchronous pipelines, generally speaking, reduce power, die area, and timing costs relative to synchronous pipelines.

One drawback of using asynchronous pipelines instead of synchronous pipelines, though, is that asynchronous pipelines use per-stage feedback when transmitting data from one stage of the pipeline to the next stage in the pipeline. Consequently, implementations of asynchronous pipelines that have longer distances between stages tend to have long feedback loops, which can cause the return path of a given feedback loop to have an associated delay that is similar to the delay associated with the request path of the same feedback loop. Thus, if a signal requires T nanoseconds to travel between two different stages in a given pipeline, data can advance in the synchronous version of that pipeline approximately every T nanoseconds, while data can advance in the asynchronous version of that pipeline only every 2T nanoseconds, with the data pausing at each pipeline stage to wait for the acknowledgement feedback from the next stage in the pipeline to arrive over the return path of the associated feedback loop. Accordingly, asynchronous pipelines can have latencies that are double those of synchronous pipelines and throughputs that are half those of synchronous pipelines.

One approach to improving the latency and throughput of asynchronous pipelines involves placing adjacent pipeline stages closer together within the pipeline. However, this decrease in spacing between pipeline stages involves additional control handling at each pipeline stage, which can increase power consumption and latency in the asynchronous pipeline. Moreover, an asynchronous pipeline can include design constraints that dictate a minimum distance between adjacent pipeline stages. For example, pipeline stages cannot be placed in the middle of a TSV or interposer channel used in inter-chip communication.

As the foregoing illustrates, what is needed in the art are more effective techniques for transporting data within computer systems and processors.

SUMMARY

One embodiment of the present invention sets forth a data pipeline. The data pipeline includes a first mousetrap element and a second mousetrap element included in a first pipeline stage. Each mousetrap element includes a request latch that, when enabled, allows a request signal to pass from the first pipeline stage to a second pipeline stage that follows the first pipeline stage in the data pipeline. Each mousetrap element also includes a data latch that, when enabled, allows a data element to pass from the first pipeline stage to the second pipeline stage. Each mousetrap element further includes a latch controller that, in operation, enables and disables the request latch and the data latch based on a phase signal, wherein the phase signal alternates between a first value that configures the first mousetrap element to transmit data to the second pipeline stage and a second value that configures the second mousetrap element to transmit data to the second pipeline stage.

One technical advantage of the disclosed techniques relative to the prior art is that, with the disclosed techniques, a first stage in an asynchronous data pipeline is able to transmit a next data element to a second stage in the data pipeline before the first stage receives an acknowledgment from the second stage related to a previously transmitted data element. Accordingly, the disclosed techniques increase data throughput relative to conventional asynchronous pipelines, where a given stage in the pipeline has to wait for an acknowledgment from a subsequent stage in the pipeline related to the previously transmitted data element before transmitting the next data element to the subsequent pipeline stage. Another technical advantage is that the disclosed techniques, when implemented in an asynchronous data pipeline, reduce power consumption and latency relative to prior art solutions that attempt to place stages of the pipeline closer together, thereby requiring additional control handling. Yet another technical advantage is that the disclosed techniques, when implemented in an asynchronous data pipeline, reduce timing delays, power consumption, and die space relative to conventional synchronous data pipelines that require additional hardware and logic in order to transmit clock signals along with data across different pipeline stages. These technical advantages provide one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

Figure 1:
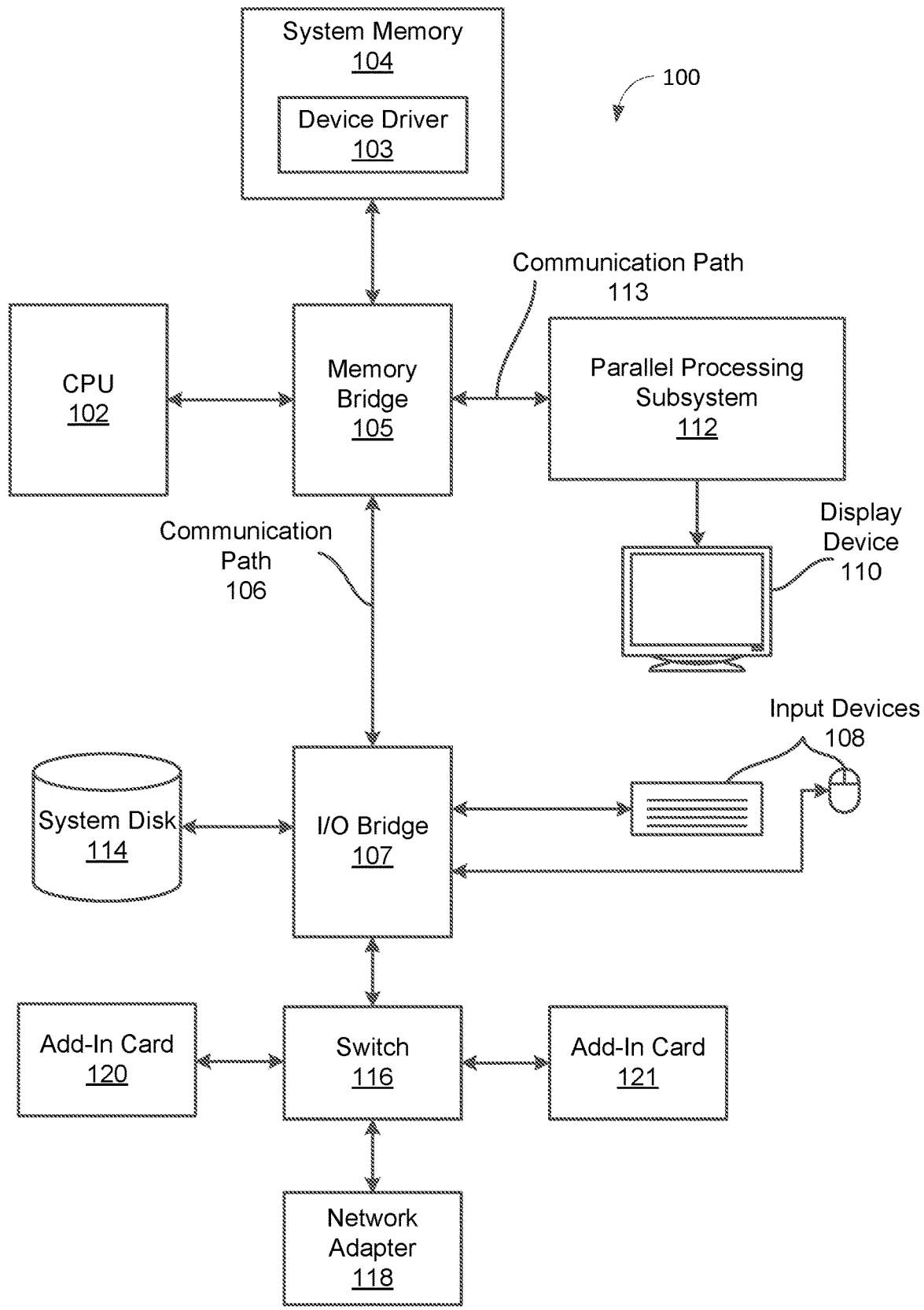
FIG. 1 illustrates a computer system configured to implement one or more aspects of the various embodiments.

In the following description, numerous specific details are set forth to provide a more thorough understanding of the various embodiments. However, it will be apparent to one of skill in the art that the inventive concepts may be practiced without one or more of these specific details.

General Overview

Computing devices such as personal computers, laptop computers, servers, workstations, mobile phones, tablets, game consoles, and/or smartwatches generally operate by collecting, processing, transmitting, and/or outputting data via various hardware and software components. More specifically, a central processing unit (CPU) executes instructions that implement an operating system and/or one or more applications on a computing device. A graphics processing unit (GPU) in the computing device can perform specialized operations related to computer graphics, image processing, machine learning, linear algebra, statistics, and/or other types of parallel processing. These instructions and data processed via the instructions are stored in memory and/or one or more disk drives and transferred to the CPU or GPU via one or more bridges or buses.

On a smaller scale, digital logic pipelines can be used to transport data within or between integrated circuits such as CPUs and/or GPUs. For example, digital logic pipelines could be used to transport data over relatively long distances across a GPU die or across intra-package links such as short-reach interposer channels, through-silicon vias (TSVs), or fine-grained face-to-face interfaces.

Existing pipeline circuits for transporting data within computer systems and processors are generally source-synchronous, where the clock of a transmitter is forwarded along with the data. The data and clock signals are then synchronized upon arrival at a receiver, which may act on a clock period or phase that differs from that of the transmitter. However, synchronous pipelines incur certain costs when forwarding a clock signal with data.

More specifically, a synchronous pipeline typically includes a valid signal that indicates whether a transmitter has valid data to transport, a data bus having a width N over which the data is transmitted, and a ready signal in the direction opposite the data transmission that indicates whether a receiver is ready to receive the data from the transmitter. In addition, retiming stages that include registers for all of the various signals are inserted at intervals along the data bus such that the signals are able to traverse the distances between retiming stages within a single clock cycle. To maintain full throughput across the pipeline, each retiming stage also includes a skid buffer that provides a redundant set of data registers, which enables the data to advance within the pipeline at each clock cycle before the "ready" value from the next stage in the pipeline is known. Accordingly, the additional hardware and logic needed to implement a given retiming stage includes approximately 2N flip-flop elements, the associated multiplexer elements, and a certain amount of extra control logic. Each flip-flop element also imposes a timing delay on the pipeline arising from the setup and hold time required to accurately capture data at the input of the flip-flop element.

To reduce the overhead attributable to synchronous pipelines, a synchronous pipeline can be replaced with an asynchronous pipeline that does not have any type of global timing controller. In an asynchronous pipeline, a current stage in the pipeline transmits control signals to a previous stage in the pipeline to trigger the transmission of data from the previous stage to the current stage without the use of a global clock. Because data is transmitted across stages in the pipeline without a global clock, asynchronous pipelines, generally speaking, reduce power, die area, and timing costs relative to synchronous pipelines.

On the other hand, asynchronous pipelines use per-stage feedback when transmitting data from one stage of the pipeline to the next stage in the pipeline. Consequently, implementations of asynchronous pipelines that have longer distances between stages tend to have long feedback loops, which can cause the return path of a given feedback loop to have an associated delay that is similar to the delay associated with the request path of the same feedback loop. Thus, if a signal requires T nanoseconds to travel between two different stages in a given pipeline, data can advance in the synchronous version of that pipeline approximately every T nanoseconds, while data can advance in the asynchronous version of that pipeline only every 2T nanoseconds, with the data pausing at each pipeline stage to wait for the acknowledgement feedback from the next stage in the pipeline to arrive over the return path of the associated feedback loop. Accordingly, asynchronous pipelines can have latencies that are double those of synchronous pipelines and throughputs that are half those of synchronous pipelines.

To improve throughput and latency associated with transmitting data across pipeline stages in an asynchronous pipeline, each pipeline stage can include two or more mousetrap elements that independently store and transmit data. Each mousetrap element includes a request latch and a data latch that, when enabled, allow a request signal and a data element to pass from a current pipeline stage to the next pipeline stage in the data pipeline. Each mousetrap element also includes a latch controller that enables and disables the request latch and the data latch based on a phase signal that alternates between a first value that configures the first mousetrap element to transmit data to the next pipeline stage and a second value that configures the second mousetrap element to transmit data to the next pipeline stage.

Each pipeline stage also includes a phase controller, which generates the phase signal that controls the operation of the mousetrap elements in the pipeline stage. The phase signal generated by the phase controller is used to enable the latches in a selected mousetrap element at a given time and disable the latches in all remaining mousetrap elements within the same pipeline stage. To space out the transmission of data elements to the next pipeline stage, the phase signal additionally incorporates a delay between transmitting data from a first mousetrap element to the next pipeline stage and transmitting data from a second mousetrap element to the next pipeline stage.

Finally, each pipeline stage includes a fork control circuit that alternates transmission of data from a preceding pipeline stage to the mousetrap elements within a given pipeline stage, as well as a join control circuit that selectively transmits data from individual mousetrap elements in the pipeline stage to the next pipeline stage. The fork and join control circuits allow a single set of data, request, and acknowledgment wires between pipeline stages to be shared by multiple mousetrap elements in each pipeline stage instead of duplicating the set of wires for each mousetrap element in a pipeline stage.

System Overview

FIG. 1 illustrates a computer system 100 configured to implement one or more aspects of the various embodiments. In some embodiments, computer system 100 is a server machine operating in a data center or a cloud computing environment that provides scalable computing resources as a service over a network.

For explanatory purposes, multiple instances of like objects are denoted with reference numbers identifying the object and parenthetical numbers identifying the instance where needed. In some embodiments, any number of the components of the computer system 100 may be distributed across multiple geographic locations or included in one or more cloud computing environments (i.e., encapsulated shared resources, software, data, etc.) in any combination.

In various embodiments, computer system 100 includes, without limitation, a central processing unit (CPU) 102 and a system memory 104 coupled to a parallel processing subsystem 112 via a memory bridge 105 and a communication path 113. Memory bridge 105 is further coupled to an I/O (input/output) bridge 107 via a communication path 106, and I/O bridge 107 is, in turn, coupled to a switch 116.

In one embodiment, I/O bridge 107 is configured to receive user input information from optional input devices 108, such as a keyboard or a mouse, and forward the input information to CPU 102 for processing via communication path 106 and memory bridge 105. In some embodiments, computer system 100 may be a server machine in a cloud computing environment. In such embodiments, computer system 100 may not have input devices 108. Instead, computer system 100 may receive equivalent input information by receiving commands in the form of messages transmitted over a network and received via the network adapter 118. In one embodiment, switch 116 is configured to provide connections between I/O bridge 107 and other components of the computer system 100, such as a network adapter 118 and various add-in cards 120 and 121.

In one embodiment, I/O bridge 107 is coupled to a system disk 114 that may be configured to store content and applications and data for use by CPU 102 and parallel processing subsystem 112. In one embodiment, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high definition DVD), or other magnetic, optical, or solid state storage devices. In various embodiments, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 includes a graphics subsystem that delivers pixels to an optional display device 110 that may be any conventional cathode ray tube, liquid crystal display, light-emitting diode display, or the like. In such embodiments, the parallel processing subsystem 112 incorporates circuitry optimized for graphics and video processing, including, for example, video output circuitry. Such circuitry may be incorporated across one or more parallel processing units ("PPUs"), also referred to herein as parallel processors, included within parallel processing subsystem 112. In other embodiments, the parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In other embodiments, the one or more PPUs included within parallel processing subsystem 112 may be configured to perform graphics processing, general purpose processing, and compute processing operations. System memory 104 includes at last one device driver 103 configured to manage the processing operations of the one or more PPUs within parallel processing subsystem 112.

In various embodiments, parallel processing subsystem 112 may be integrated with one or more of the other elements of FIG. 1 to form a single system. For example, parallel processing subsystem 112 may be integrated with CPU 102 and other connection circuitry on a single chip to form a system on chip (SoC).

In one embodiment, CPU 102 is the master processor of computer system 100, controlling and coordinating operations of other system components. In one embodiment, CPU 102 issues commands that control the operation of PPUs. In some embodiments, communication path 113 is a PCI Express link, in which dedicated lanes are allocated to each PPU, as is known in the art. Other communication paths may also be used. PPU advantageously implements a highly parallel processing architecture. A PPU may be provided with any amount of local parallel processing memory (PP memory).

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other embodiments, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

Figure 2:
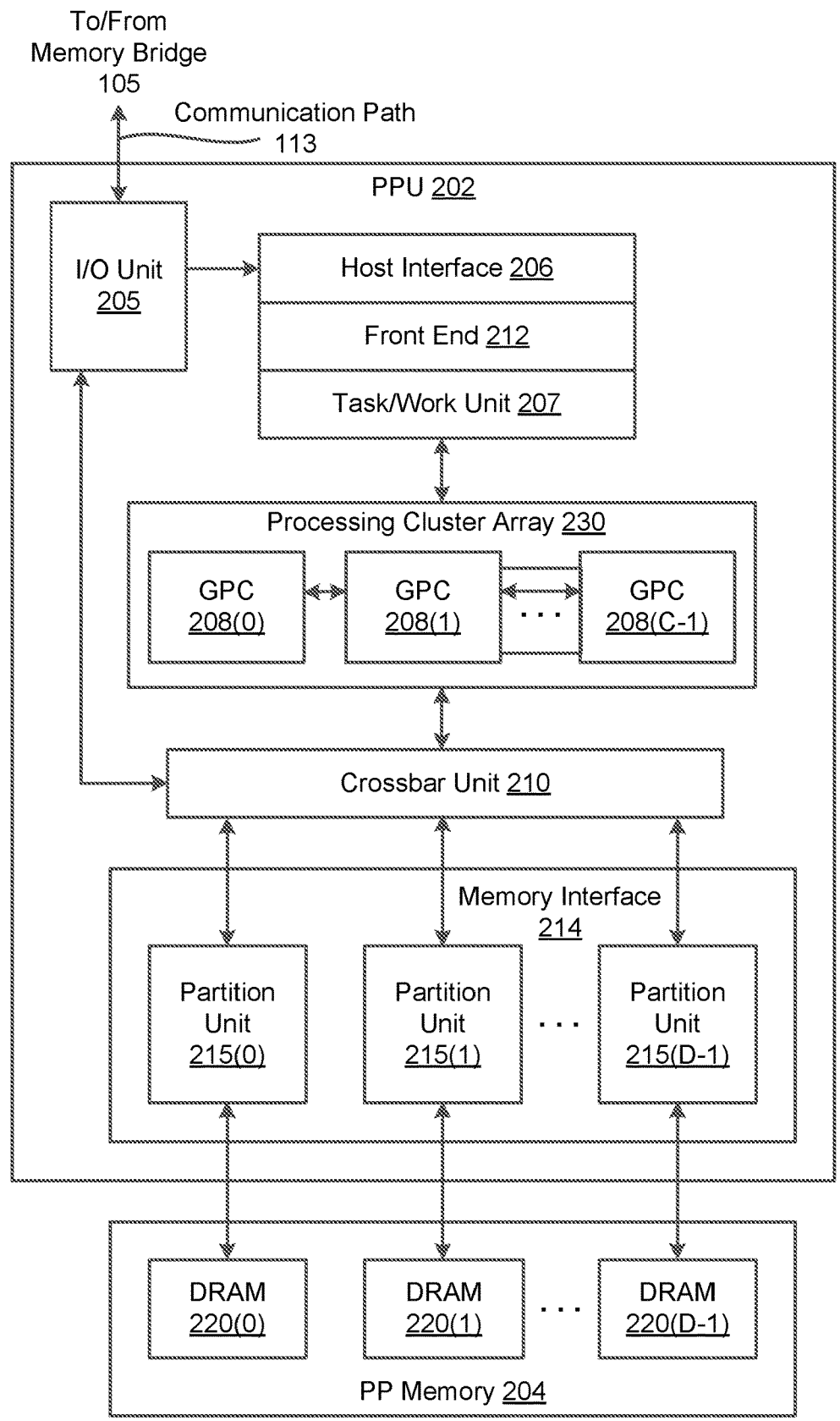
FIG. 2 is a block diagram of a parallel processing unit (PPU) included in the parallel processing subsystem of FIG. 1, according to various embodiments.

FIG. 2 is a block diagram of a parallel processing unit (PPU) 202 included in the parallel processing subsystem 112 of FIG. 1, according to various embodiments. Although FIG. 2 depicts one PPU 202, as indicated above, parallel processing subsystem 112 may include any number of PPUs 202. As shown, PPU 202 is coupled to a local parallel processing (PP) memory 204. PPU 202 and PP memory 204 may be implemented using one or more integrated circuit devices, such as programmable processors, application specific integrated circuits (ASICs), or memory devices, or in any other technically feasible fashion.

In some embodiments, PPU 202 comprises a graphics processing unit (GPU) that may be configured to implement a graphics rendering pipeline to perform various operations related to generating pixel data based on graphics data supplied by CPU 102 and/or system memory 104. When processing graphics data, PP memory 204 can be used as graphics memory that stores one or more conventional frame buffers and, if needed, one or more other render targets as well. Among other things, PP memory 204 may be used to store and update pixel data and deliver final pixel data or display frames to an optional display device 110 for display. In some embodiments, PPU 202 also may be configured for general-purpose processing and compute operations. In some embodiments, computer system 100 may be a server machine in a cloud computing environment. In such embodiments, computer system 100 may not have a display device 110. Instead, computer system 100 may generate equivalent output information by transmitting commands in the form of messages over a network via the network adapter 118.

In some embodiments, CPU 102 writes a stream of commands for PPU 202 to a data structure (not explicitly shown in either FIG. 1 or FIG. 2) that may be located in system memory 104, PP memory 204, or another storage location accessible to both CPU 102 and PPU 202. A pointer to the data structure is written to a command queue, also referred to herein as a pushbuffer, to initiate processing of the stream of commands in the data structure. In one embodiment, the PPU 202 reads command streams from the command queue and then executes commands asynchronously relative to the operation of CPU 102. In embodiments where multiple pushbuffers are generated, execution priorities may be specified for each pushbuffer via device driver 103 to control scheduling of the different pushbuffers.

In one embodiment, PPU 202 includes an I/O (input/output) unit 205 that communicates with the rest of computer system 100 via the communication path 113 and memory bridge 105. In one embodiment, I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to the PP memory 204) may be directed to a crossbar unit 210. In one embodiment, host interface 206 reads each command queue and transmits the command stream stored in the command queue to a task/work unit 207.

As mentioned above in conjunction with FIG. 1, the connection of PPU 202 to the rest of computer system 100 may be varied. In some embodiments, parallel processing subsystem 112, which includes at least one PPU 202, is implemented as an add-in card that can be inserted into an expansion slot of computer system 100. In other embodiments, PPU 202 can be integrated on a single chip with a bus bridge, such as memory bridge 105 or I/O bridge 107. Again, in still other embodiments, some or all of the elements of PPU 202 may be included along with CPU 102 in a single integrated circuit or system on chip (SoC).

In one embodiment, front end 212 transmits processing tasks received from host interface 206 to a work distribution unit (not shown) within task/work unit 207. In one embodiment, the work distribution unit receives pointers to processing tasks that are encoded as task metadata (TMD) and stored in memory. The pointers to TMDs are included in a command stream that is stored as a command queue and received by front end 212 from host interface 206. Processing tasks that may be encoded as TMDs include indices associated with the data to be processed as well as state parameters and commands that define how the data is to be processed. For example, the state parameters and commands could define the program to be executed on the data. Also for example, the TMD could specify the number and configuration of the set of CTAs. Generally, each TMD corresponds to one task. Task/work unit 207 receives tasks from front end 212 and ensures that GPCs Y08 are configured to a valid state before the processing task specified by each one of the TMDs is initiated. A priority may be specified for each TMD that is used to schedule the execution of the processing task. Processing tasks also may be received from processing cluster array 230. Optionally, the TMD may include a parameter that controls whether the TMD is added to the head or the tail of a list of processing tasks (or to a list of pointers to the processing tasks), thereby providing another level of control over execution priority.

In one embodiment, PPU 202 implements a highly parallel processing architecture based on a processing cluster array 230 that includes a set of C general processing clusters (GPCs) 208, where C≥1. Each GPC 208 is capable of executing a large number (e.g., hundreds or thousands) of threads concurrently, where each thread is an instance of a program. In various applications, different GPCs 208 may be allocated for processing different types of programs or for performing different types of computations. The allocation of GPCs 208 may vary depending on the workload arising for each type of program or computation.

In one embodiment, memory interface 214 includes a set of D of partition units 215, where D≥1. Each partition unit 215 is coupled to one or more dynamic random access memories (DRAMs) 220 residing within PPM memory 204. In some embodiments, the number of partition units 215 equals the number of DRAMs 220, and each partition unit 215 is coupled to a different DRAM 220. In other embodiments, the number of partition units 215 may be different than the number of DRAMs 220. Persons of ordinary skill in the art will appreciate that a DRAM 220 may be replaced with any other technically suitable storage device. In operation, various render targets, such as texture maps and frame buffers, may be stored across DRAMs 220, allowing partition units 215 to write portions of each render target in parallel to efficiently use the available bandwidth of PP memory 204.

In one embodiment, a given GPC 208 may process data to be written to any of the DRAMs 220 within PP memory 204. In one embodiment, crossbar unit 210 is configured to route the output of each GPC 208 to the input of any partition unit 215 or to any other GPC 208 for further processing. GPCs 208 communicate with memory interface 214 via crossbar unit 210 to read from or write to various DRAMs 220. In some embodiments, crossbar unit 210 has a connection to I/O unit 205, in addition to a connection to PP memory 204 via memory interface 214, thereby enabling the processing cores within the different GPCs 208 to communicate with system memory 104 or other memory not local to PPU 202. In the embodiment of FIG. 2, crossbar unit 210 is directly connected with I/O unit 205. In various embodiments, crossbar unit 210 may use virtual channels to separate traffic streams between the GPCs 208 and partition units 215.

In one embodiment, GPCs 208 can be programmed to execute processing tasks relating to a wide variety of applications, including, without limitation, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel/fragment shader programs), general compute operations, machine learning operations, etc. In operation, PPU 202 is configured to transfer data from system memory 104 and/or PP memory 204 to one or more on-chip memory units, process the data, and write result data back to system memory 104 and/or PP memory 204. The result data may then be accessed by other system components, including CPU 102, another PPU 202 within parallel processing subsystem 112, or another parallel processing subsystem 112 within computer system 100.

In one embodiment, any number of PPUs 202 may be included in parallel processing subsystem 112. For example, multiple PPUs 202 may be provided on a single add-in card, or multiple add-in cards may be connected to communication path 113, or one or more of PPUs 202 may be integrated into a bridge chip. PPUs 202 in a multi-PPU system may be identical to or different from one another. For example, different PPUs 202 might have different numbers of processing cores and/or different amounts of PP memory 204. In implementations where multiple PPUs 202 are present, those PPUs may be operated in parallel to process data at a higher throughput than is possible with a single PPU 202. Systems incorporating one or more PPUs 202 may be implemented in a variety of configurations and form factors, including, without limitation, desktops, laptops, handheld personal computers or other handheld devices, servers, workstations, game consoles, embedded systems, and the like.

Those skilled in the art will appreciate that data may be moved over relatively long distances across a die occupied by PPU 202. For example, the die could include a floorplan that is around 20 mm per side, with long routing channels dedicated to transporting data across various components of PPU 202. Conventional techniques for performing this type of long-distance data transfer include standard synchronous ready/valid interfaces and a clock signal that is forwarded with the data at moderate frequencies. However, additional power and area on the die are required to distribute the clock signal with the data. Further, synchronous fabrics require timing margins (i.e., delays) for cross-chip variation and noise, which increase the latency of data transfer.

In one or more embodiments, an asynchronous data pipeline is used to transport data across a die occupied by PPU 202 and/or other components of computer system 100. The asynchronous data pipeline includes a series of pipeline stages separated by relatively long distances, so that a data signal requires time T to travel from a first pipeline stage to a second pipeline stage, and an acknowledgment of the data signal also requires around time T to propagate from the second pipeline stage back to the first pipeline stage. As described in further detail below, each stage in the asynchronous data pipeline includes multiple mousetrap elements to increase data throughput across the asynchronous data pipeline. Thus, while a first mousetrap element in a first pipeline stage waits for an acknowledgment of data stored in the first mousetrap element from a second pipeline stage following the first pipeline stage, a second mousetrap element in the first pipeline stage can transmit data to the second pipeline stage. Because a data element can move between pipeline stages at least every time T instead of every 2T, the asynchronous data pipeline at least doubles the throughput and halves the latency associated with a conventional asynchronous pipeline stage that transmits a data element only after an acknowledgment of the preceding data element is received from the next pipeline stage.

High-Throughput Asynchronous Data Pipeline

Figure 3:
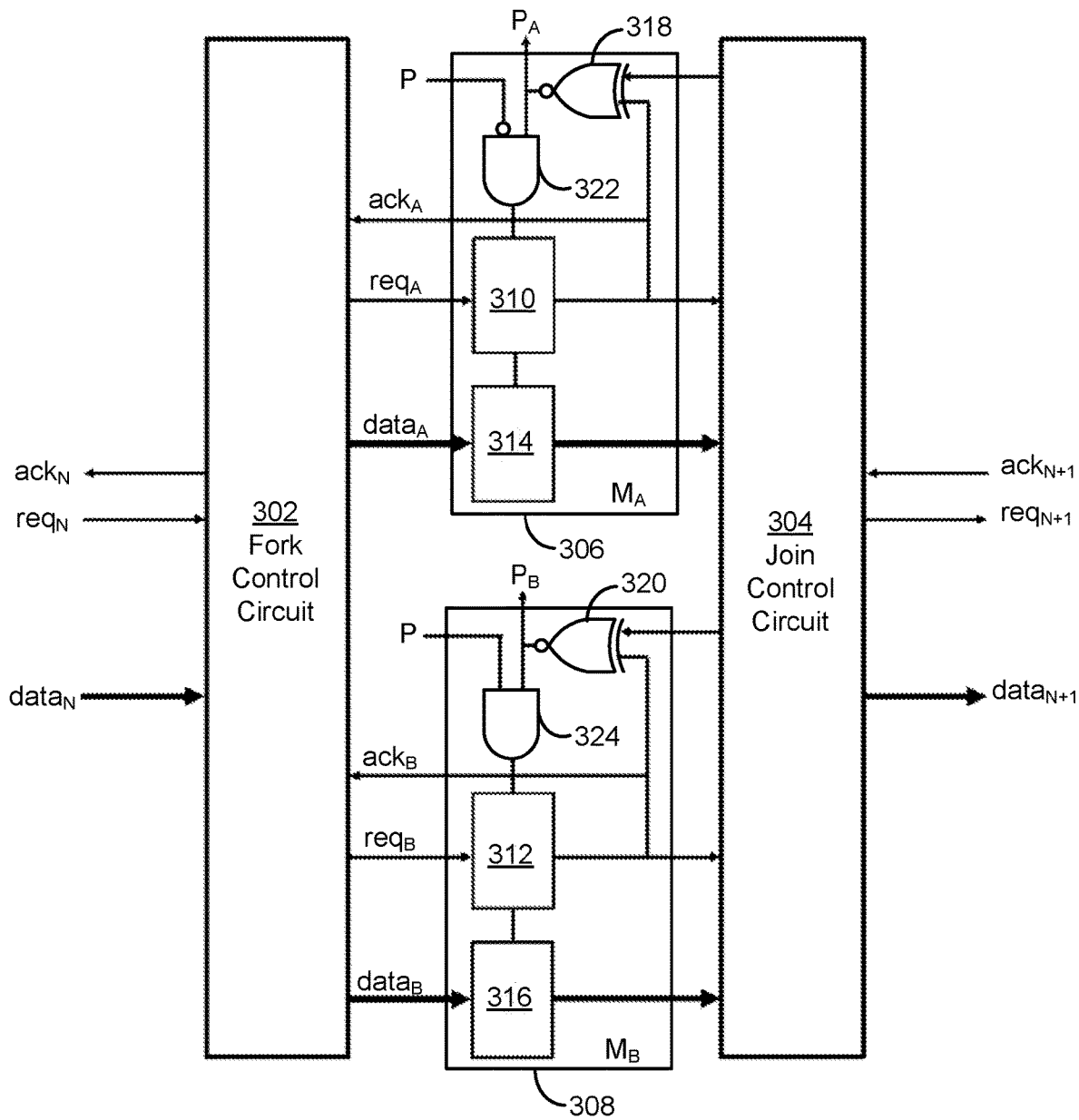
FIG. 3 illustrates a pipeline stage in an asynchronous data pipeline that transports data from one location to another within the PPU of FIG. 2, according to various embodiments.

FIG. 3 illustrates a pipeline stage in an asynchronous data pipeline for that transports data from one location to another within the PPU of FIG. 2, according to various embodiments. As shown in FIG. 3, input into the pipeline stage includes a request signal denoted by "$req_N$" and a data signal denoted by "$data_N$" from the previous pipeline stage in the asynchronous data pipeline, as well as an acknowledgement signal denoted by "$ack_{N+1}$" from the subsequent pipeline stage in the asynchronous data pipeline. Output from the pipeline stage includes an acknowledgement signal denoted by "$ack_N$" that is transmitted to the previous pipeline stage, along with a request signal denoted by "$req_{N+1}$" and a data signal denoted by "$data_{N+1}$" that are transmitted to the subsequent pipeline stage.

A given pipeline stage uses the request and acknowledgment signals to communicate with adjacent pipeline stages in the asynchronous data pipeline. More specifically, the $N^{th}$ pipeline stage uses an outgoing request signal "$req_{N+1}$" to the next pipeline stage to communicate the transmission of a data element (e.g., a data word and/or another unit of data) over the data signal "$data_{N+1}$" to the next pipeline stage. After the data has arrived at the next pipeline stage, the next pipeline stage transmits an acknowledgment of the data element over the acknowledgment signal "$ack_{N+1}$" to the $N^{th}$ pipeline stage.

In some embodiments, pipeline stages in the asynchronous data pipeline communicate with one another via transition signaling, in which each transition up or down on a given request or acknowledgment signal represents the arrival of a new data element. When the asynchronous data pipeline is empty, all request and acknowledgment signals can be low. When the first data element is transmitted across successive stages of the asynchronous data pipeline, the values of the request and acknowledgment signals are flipped to high. The second data element that is transmitted across the stages then flips the request and acknowledgment signals back to low.

To increase throughput and reduce latency in the asynchronous data pipeline, the pipeline stage includes two mousetrap elements 306-308, which are denoted by "$M_A$" and "$M_B$." Mousetrap element 306 includes a request latch 310, a data latch 314, and a latch controller that includes an XNOR gate 318 and an AND gate 322. Mousetrap element 308 similarly includes a request latch 312, a data latch 316, and a latch controller that includes an XNOR gate 320 and an AND gate 324.

In one or more embodiments, data latches 314-316 include transparent latches that are normally enabled, which allows data to pass through to the next pipeline stage. As data elements pass through the pipeline stage, the data elements pass through mousetrap elements 306-308 in an alternating fashion, so that a given data element is routed to the mousetrap element that is different from the preceding data element. Because the pipeline stage includes two mousetrap elements 306-308, the pipeline stage can be considered as having two "credits" for transmitting data to the next pipeline stage. When a first data element advances from one mousetrap element to the next pipeline stage, one credit is deducted, but one credit remains to indicate the available state of the other mousetrap element in the pipeline stage. Thus, a second data element from the other mousetrap element can be transmitted to the next pipeline stage while the pipeline stage waits for an acknowledgment of the first data element from the next pipeline stage. Once both data elements have passed to the next pipeline stage, the pipeline stage waits for an acknowledgment of the first data element before transmitting a third data element to the next pipeline stage. Consequently, if a data element requires time T to travel between two pipeline stages, a new data element can flow through the asynchronous data pipeline every T instead of every 2T, as required by a conventional asynchronous data pipeline with a single mousetrap element in every pipeline stage.

In some embodiments, the alternating use of mousetrap elements 306-308 in the pipeline stage to transmit data is controlled by a phase signal "P" that is generated by a phase controller (not shown) and inputted into the latch controller of each mousetrap element. The phase signal switches between a first (e.g., low) value that configures request latch 310 and data latch 314 in mousetrap element 306 to transmit data to the next pipeline stage and a second (e.g., high) value that configures request latch 312 and data latch 316 in mousetrap element 308 to transmit data to the next pipeline stage. When the phase signal opens the request latch and data latch in a given mousetrap element, the phase signal also closes the request latch and data latch in the other mousetrap element in the same pipeline stage (e.g., because the latch controller in one mousetrap element operates based on the phase signal and the latch controller in the other mousetrap element operates based on a negation of the phase signal). Generation of the phase signal is described in further detail below with respect to FIG. 4.

As shown in FIG. 3, an additional control signal "$P_A$" generated by XNOR gate 318 in the latch controller of mousetrap element 306 is used to control the enabling and disabling of request latch 310 and data latch 314 in mousetrap element 306. Similarly, an additional control signal "$P_B$" generated by XNOR gate 320 in the latch controller of mousetrap element 308 is used to control the enabling and disabling of request latch 312 and data latch 316 in mousetrap element 308. Each of XNOR gates 318 and 320 receives, as input, the acknowledgment signal "$ack_{N+1}$" received from the next pipeline stage and the individual acknowledgment signal "$ack_A$" or "$ack_B$" that indicates whether or not the request signal has passed through the request latch in the corresponding mousetrap element. When both input signals match, the XNOR gate outputs a high value. When the input signals do not match, the XNOR gate outputs a low value. Thus, the output of the XNOR gate indicates whether or not a request signal from the corresponding mousetrap element has been acknowledged by the next pipeline stage.

The output of XNOR gates 318 and 320 is combined with "P" at the corresponding AND gates 322 and 324 of the same mousetrap elements 306 and 308, and the output of each AND gate is used to open (i.e., enable) or close (i.e., disable) the request latch and data latch in the same mousetrap element. Consequently, request latch 310 and data latch 314 in mousetrap element 306 are open when "$P_A$" is high and "P" is low, and request latch 312 and data latch 316 in mousetrap element 308 are open when both "$P_B$" and "P" are high.

The pipeline stage also includes a fork control circuit 302 and a join control circuit 304. Fork control circuit 302 and join control circuit 304 allow a single set of data, request, and acknowledgment wires between pipeline stages to be shared by mousetrap elements in each pipeline stage instead of duplicating the set of wires for each mousetrap element in the pipeline stage.

Fork control circuit 302 alternates transmission of data from a preceding pipeline stage in the asynchronous data pipeline to mousetrap elements 306 and 308. Fork control circuit 302 generates one set of request and data signals (denoted by "$req_A$" and "$data_A$") as input into mousetrap element 306 and a different set of request and data signals (denoted by "$req_B$" and "$data_B$") as input into mousetrap element 308 based on the request signal "$req_N$" and data signal "$data_N$" received from the previous pipeline stage. Fork control circuit 302 also generates an acknowledgement signal "$ack_N$" to the previous pipeline stage based on a first acknowledgment signal for mousetrap element 306 (denoted by "$ack_A$") and a second acknowledgment signal for mousetrap element 306 (denoted by "$ack_B$"). Fork control circuit 302 is described in further detail below with respect to FIG. 5.

Join control circuit 304 selectively transmits data from mousetrap element 306 or 308 to a subsequent pipeline stage in the asynchronous data pipeline. Join control circuit 304 generates one acknowledgment signal that is inputted into XNOR gate 318 and another acknowledgment signal that is inputted into XNOR gate 320 based on the acknowledgment signal "$ack_{N+1}$" received from the next pipeline stage. Join control circuit 304 also generates the request signal "$req_{N+1}$" to the next pipeline stage based on the request signals "$req_A$" and "$req_B$" from the two mousetrap elements 306-308. Join control circuit 304 further generates the data signal "$data_{N+1}$" to the next pipeline sage based on the data signals "$data_A$" and "$data_B$" from the two mousetrap elements 306-308. Join control circuit 304 is described in further detail below with respect to FIG. 6.

Figure 4:
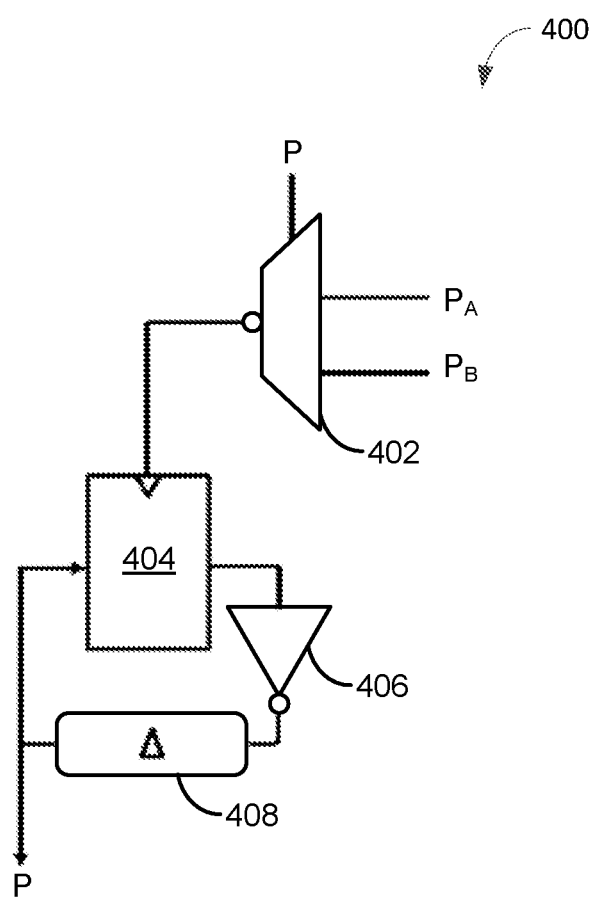
FIG. 4 illustrates a phase controller for the pipeline stage of FIG. 3, according to various embodiments.

FIG. 4 illustrates a phase controller 400 for the pipeline stage of FIG. 3, according to various embodiments. As mentioned above, phase controller 400 generates a phase signal "P" that is used to alternate transmission of data elements from mousetrap elements 306 and 308 to the next pipeline stage of the asynchronous data pipeline.

As shown in FIG. 4, phase controller 400 includes a multiplexer 402, a flip-flop 404, an inverter 406, and a delay element 408. Multiplexer 402 uses the current value of "P" to select between "$P_A$" generated by XNOR gate 318 in mousetrap element 306 and "$P_B$" generated by XNOR gate 320 in mousetrap element 308. The output of multiplexer 402 is fed into flip-flop 404 and used to toggle the output of flip-flop 404. The output of flip-flop 404 is then inverted by inverter 406 and fed into delay element 408. Finally, after the delay associated with delay element 408 has passed, the new value of "P" is outputted.

In one or more embodiments, delay element 408 adds a delay between an end of a first value of "P" that configures one mousetrap element to transmit data to the next pipeline stage and a beginning of a second value of "P" that configures the other mousetrap element to transmit data to the next pipeline stage. This delay prevents consecutive data elements from being transmitted too closely together (and from potentially overtaking one another) along a shared data line. For example, the delay could be set to the time T required for data to reach the next pipeline stage to match the steady-state throughput of the asynchronous data pipeline. Because data elements are unlikely to experience large "drifts" toward one another over a certain number of pipeline stages, delay element 408 can be included in the phase controller for a subset of pipeline stages (e.g., every second, third, fourth, etc. pipeline stage).

Figure 5:
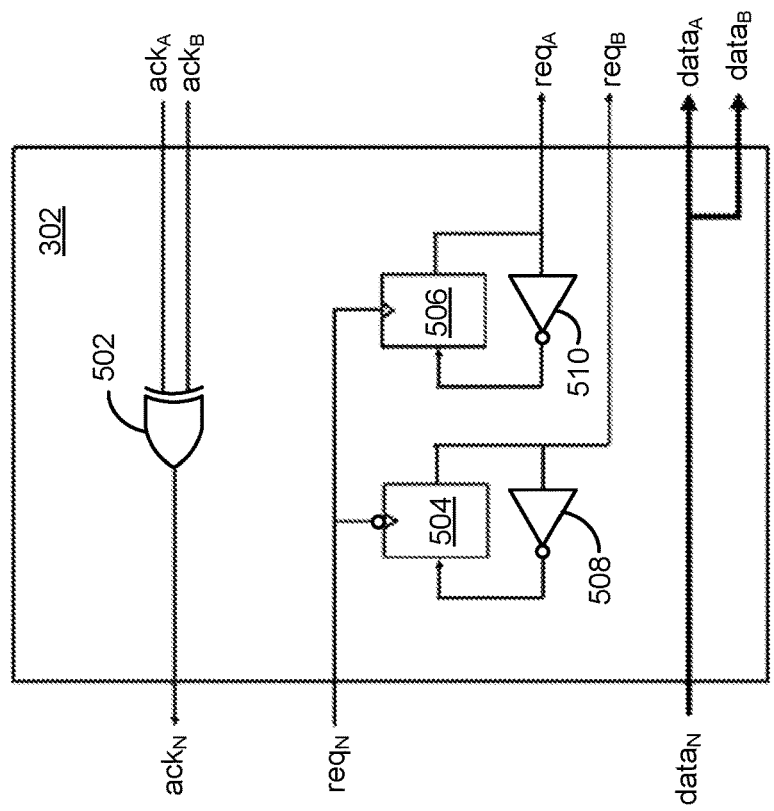
FIG. 5 illustrates a fork control circuit included in the pipeline stage of FIG. 3, according to various embodiments.

FIG. 5 illustrates fork control circuit 302 included in the pipeline stage of FIG. 3, according to various embodiments. As mentioned above, fork control circuit 302 alternates between sending data to individual mousetrap elements 306 and 308 in the pipeline stage. More specifically, fork control circuit 302 includes an XOR gate 502 that generates a high value for "$ack_N$" when one of "$ack_A$" or "$ack_B$" is high and a low value for "$ack_N$" when both "$ack_A$" and "$ack_B$" are high or low. In other words, XOR gate 502 generates an acknowledgment signal that is transmitted to the previous pipeline stage. This acknowledgment signal communicates an acknowledgment of a data element received by either mousetrap element 306 or 308 from the previous pipeline stage.

Fork control circuit 302 also includes a number of flip-flops 504-506 and inverters 508-510 that generate values of "$req_A$" and "$req_B$" based on "$req_N$." When a high value for "$req_N$" is received, a corresponding high value is generated for one of "$req_A$" and "$req_B$" to indicate that the data element associated with "$req_N$" is to be received by the corresponding mousetrap element. A low value is also generated for the other of "$req_A$" and "$req_B$." Thus, flip-flops 504-506 and inverters 508-510 generate "$req_A$" and "$req_B$" as negations of one another and use "$req_A$" and "$req_B$" to toggle between different values of the phase signal "P."

Fork control circuit 302 further duplicates the data signal "$data_N$" from the previous pipeline stage into two separate data signals "$data_A$" and "$data_B$" for mousetrap elements 306-308. Subsequent transmission of the data signals to the next pipeline stage is controlled by opening and closing request latches 310-312 and data latches 314-316 in mousetrap elements 306-308 based on control signals "P," "$P_A$," and "$P_B$," as discussed above.

Figure 6:
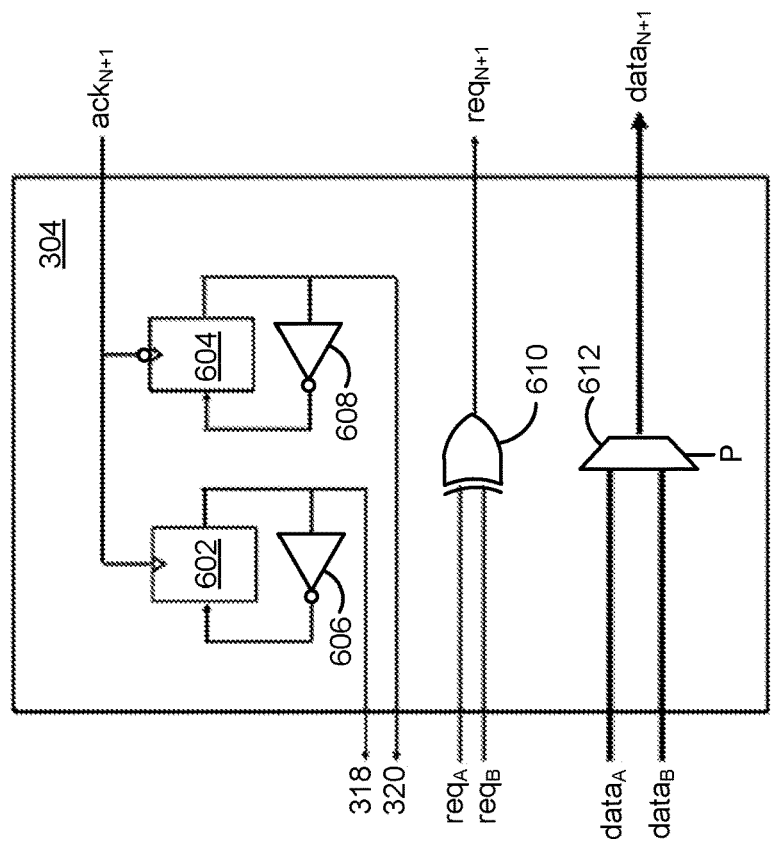
FIG. 6 illustrates a join control circuit included in the pipeline stage of FIG. 3, according to various embodiments.

FIG. 6 illustrates join control circuit 304 included in the pipeline stage of FIG. 3, according to various embodiments. As mentioned above, join control circuit 304 selectively transmits data from mousetrap element 306 or 308 to a subsequent pipeline stage in the asynchronous data pipeline. As shown in FIG. 6, join control circuit 304 includes a number of flip-flops 602-604 and a number of inverters 606-608 that generate values that are transmitted to XNOR gates 318 and 320 based on "$ack_{N+1}$." When a high value for "$ack_{N+1}$" is received, a corresponding high value is generated for one of these values to communicate the acknowledgment of the data element associated with the corresponding mousetrap element. A low value is also generated for the other value. Thus, flip-flops 602-604 and inverters 606-608 generate acknowledge values that are inputted into XNOR gates 318 and 320 as negations of one another. These acknowledge values are then used to toggle between different values of the phase signal "P."

Join control circuit 304 also includes an XOR gate 610 that generates a high value for "$req_{N+1}$" when one of "$req_A$" or "$req_B$" is high and a low value for "$req_{N+1}$" when both "$req_A$" and "$req_B$" are high or low. Thus, XOR gate 610 generates a request signal that is transmitted to the next pipeline stage. This request signal indicates the transmission of a data element from either mousetrap element 306 or 308 over the data signal "$data_{N+1}$" to the next pipeline stage.

Finally, join control circuit 304 includes a multiplexer 612 that selects between "$data_A$" and "$data_B$" for transmission over "$data_{N+1}$" to the next pipeline stage based on "P." For example, multiplexer 612 could transmit a data element from "$data_A$" over "$data_{N+1}$" when "P" indicates that request latch 310 and data latch 314 in mousetrap element 306 are open (i.e., enabled). Multiplexer 612 could transmit a data element from "$data_B$" over "$data_{N+1}$" when "P" indicates that request latch 312 and data latch 316 in mousetrap element 308 are open.

Figure 7A:
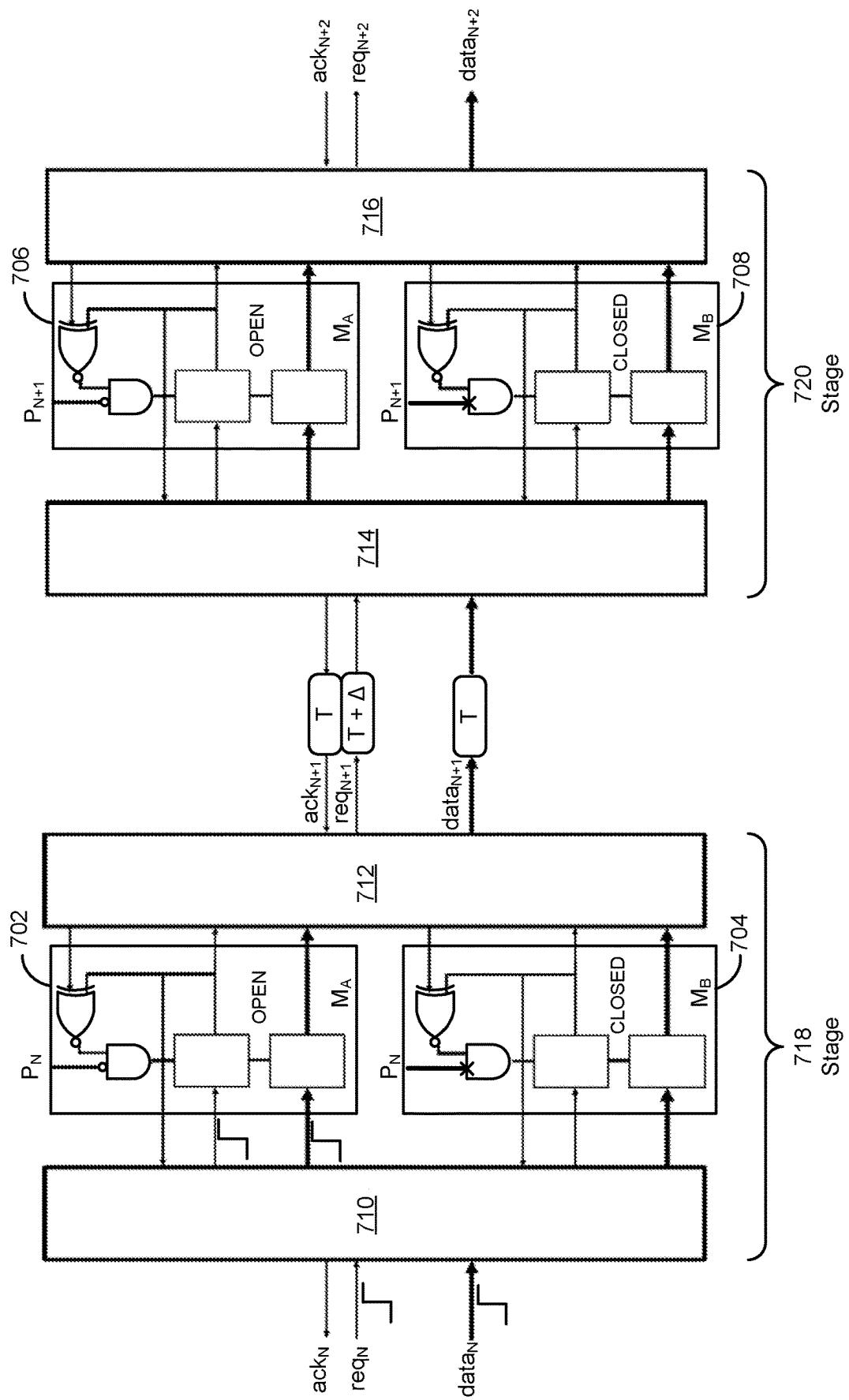
FIG. 7A illustrates an exemplar flow of data between two pipeline stages in an asynchronous data pipeline, according to various embodiments.

FIG. 7A illustrates an exemplar flow of data between two pipeline stages 718-720 in an asynchronous data pipeline, according to various embodiments. As shown in FIG. 7A, the first pipeline stage 718 includes two mousetrap elements 702-704, a fork control circuit 710, and a join control circuit 712. The second pipeline stage 720 also includes two mousetrap elements 706-708, a fork control circuit 714, and a join control circuit 716. Data transmitted from stage 718 over "data$_{N+1}$" arrives at stage 720 after time T, an acknowledgment from stage 720 over "ack$_{N+1}$" arrives at stage 718 after time T, and a request signal transmitted from stage 718 over "req$_{N+1}$" arrives at stage 720 after time T+Δ (e.g., to ensure that the request signal arrives after the corresponding data element input has stabilized at stage 720).

In FIG. 7A, a phase signal "P$_N$" for stage 718 has opened latches in mousetrap element 702 and closed latches in mousetrap element 704, and a phase signal "P$_{N+1}$" for stage 720 has opened latches in mousetrap element 706 and closed latches in mousetrap element 708. Each phase signal is used by latch controllers in the corresponding stage to alternate between a first configuration, in which the latches in the mousetrap element denoted by "M$_A$" are open and the latches in the mousetrap element denoted by "M$_B$" are closed, and a second configuration, in which the latches in the mousetrap element denoted by "M$_B$" are open and the latches in the mousetrap element denoted by "M$_A$" are closed. Consequently, the phase signal and latch controllers for each pipeline stage ensure that at most one mousetrap element in the pipeline stage is open at any given time.

FIG. 7A also illustrates the entry of a first data element into pipeline stage 718, as represented by rising transitions in "req$_N$" and "data$_N$." Because latches in mousetrap element 702 are open, fork control circuit 710 forwards the rising edge to the request latch and data latch in mousetrap element 702.

Figure 7B:
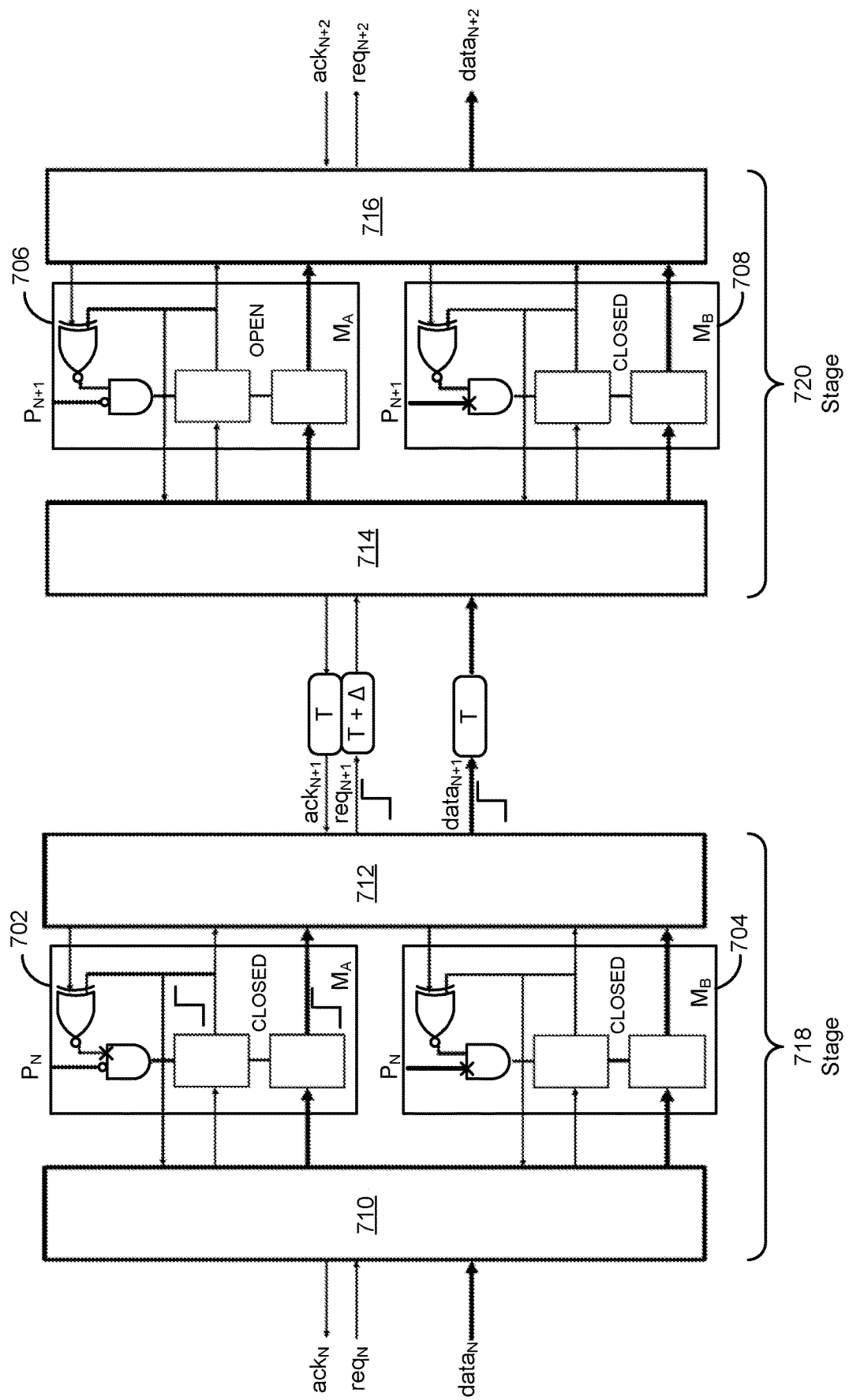
FIG. 7B illustrates an exemplar flow of data between two pipeline stages in an asynchronous data pipeline, according to other various embodiments.

FIG. 7B illustrates an exemplar flow of data between two pipeline stages 718-720 in an asynchronous data pipeline, according to other various embodiments. More specifically, FIG. 7B shows pipeline stages 718-720 after the rising transitions in "req$_N$" and "data$_N$" are passed through the request latch and data latch in mousetrap element 702. In response to the rising transitions passing through the latches of mousetrap element 702, the phase signal "P$_N$" closes the latches in mousetrap element 702. The rising transitions are also passed by join control circuit 712 along "data$_N$+1" and "req$_N$+1" toward stage 720.

Figure 7C:
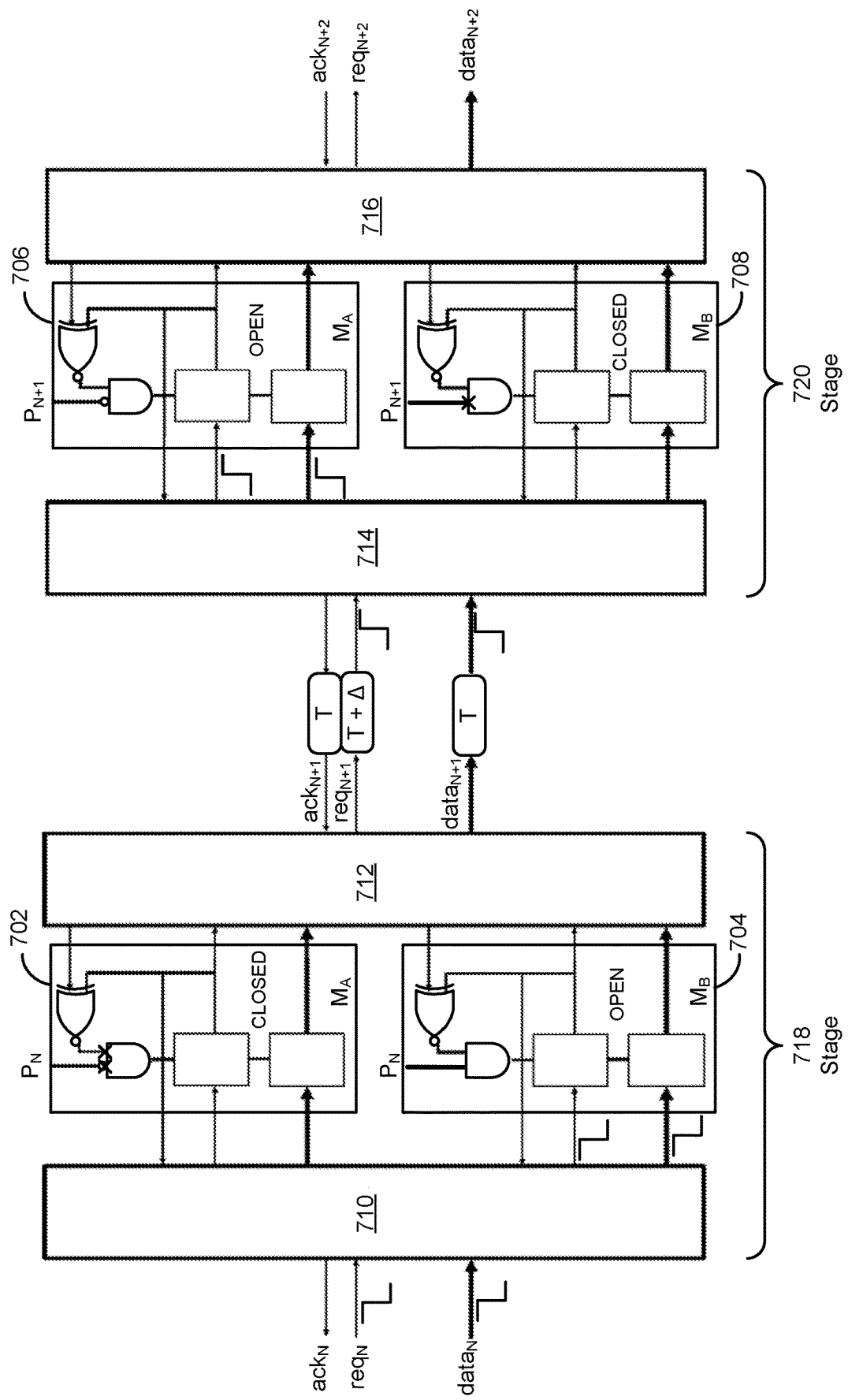
FIG. 7C illustrates an exemplar flow of data between two pipeline stages in an asynchronous data pipeline, according to other various embodiments.

FIG. 7C illustrates an exemplar flow of data between two pipeline stages 718-720 in an asynchronous data pipeline, according to other various embodiments. In FIG. 7C, time T has elapsed since the rising transitions from mousetrap element 702 were transmitted by stage 718 over "data$_{N+1}$" and "req$_{N+1}$" toward stage 720. As depicted in FIG. 7C, the rising transitions have arrived at stage 720 and have been forwarded by fork control circuit 714 to open latches in mousetrap element 706.

As shown in FIG. 7C, the phase signal "P$_N$" has been used to open the latches in mousetrap element 704. This allows falling transitions received over "req$_N$" and "data$_N$" to be forwarded by fork control circuit 710 to the request latch and data latch in mousetrap element 704.

Figure 7D:
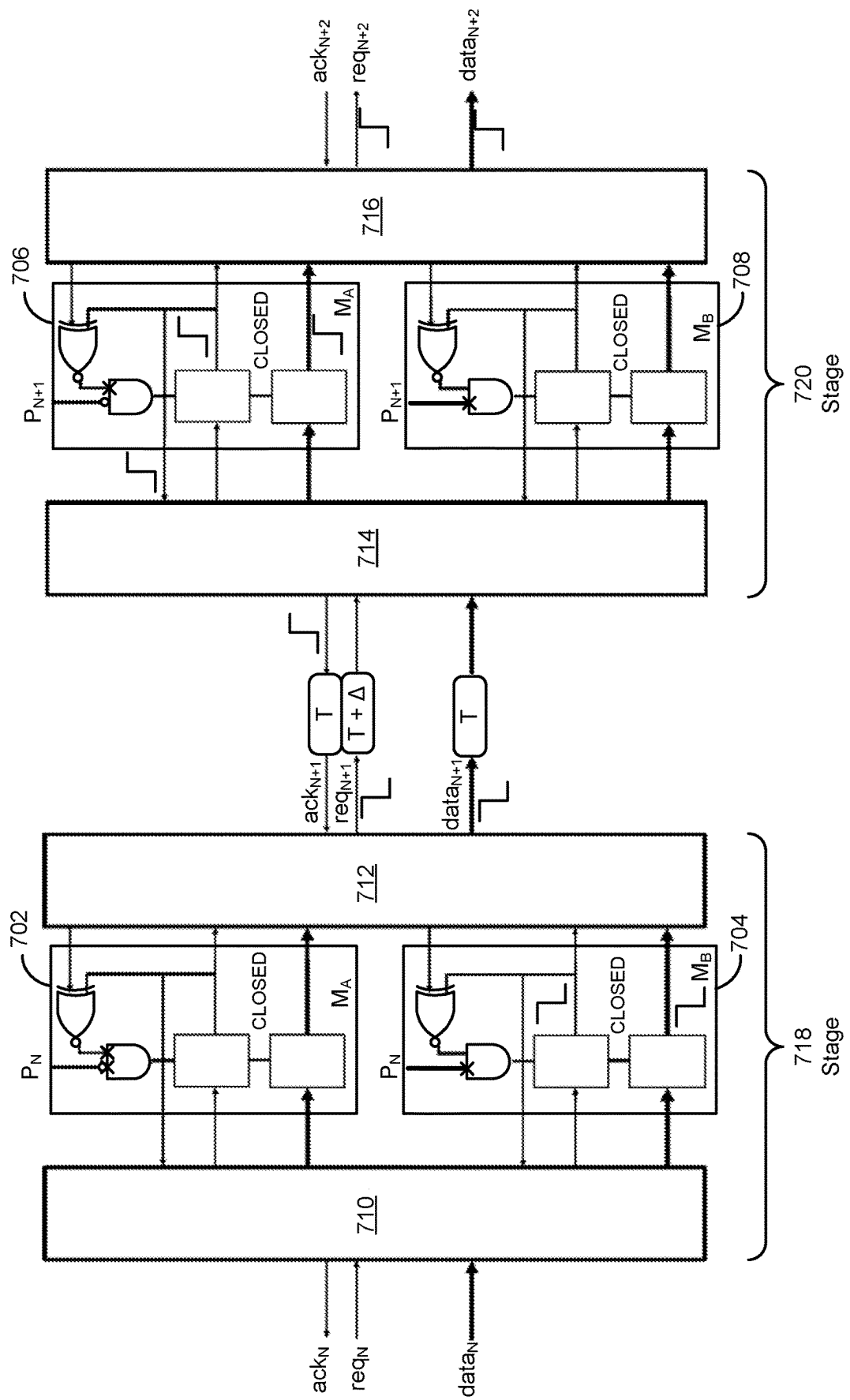
FIG. 7D illustrates an exemplar flow of data between two pipeline stages in an asynchronous data pipeline, according to other various embodiments.

FIG. 7D illustrates an exemplar flow of data between two pipeline stages 718-720 in an asynchronous data pipeline, according to other various embodiments. More specifically, FIG. 7D shows pipeline stages 718-720 after the falling transitions at the request and data latches in mousetrap element 704 have been forwarded by join control circuit 712 over "data$_{N+1}$" and "req$_{N+1}$" toward stage 720. In response to the falling transitions passing through the latches of mousetrap element 704, the phase signal "P$_N$" closes the latches in mousetrap element 704.

As shown in FIG. 7D, the rising transitions at the latches of mousetrap element 706 have been passed by join control circuit 716 onto "data$_{N+2}$" and "req$_{N+2}$" toward a pipeline stage following stage 720. Further, an acknowledgment of the rising transitions has been generated by mousetrap element 706 and is passed by fork control circuit 714 over "ack$_{N+1}$" toward stage 718 while the falling transitions from mousetrap element 704 are transmitted over "data$_{N+1}$" and "req$_{N+1}$."

Figure 7E:
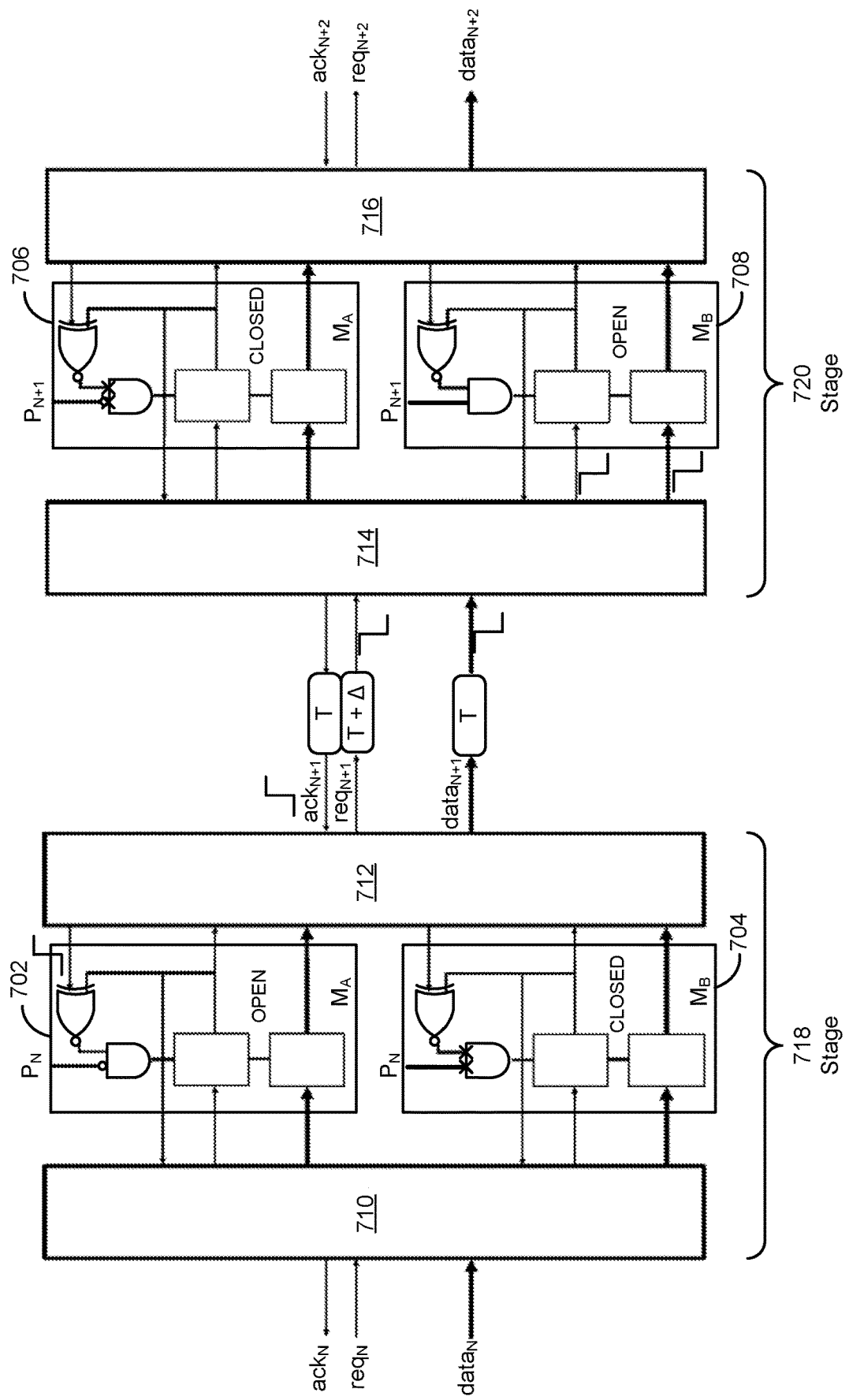
FIG. 7E illustrates an exemplar flow of data between two pipeline stages in an asynchronous data pipeline, according to other various embodiments.

FIG. 7E illustrates an exemplar flow of data between two pipeline stages 718-720 in an asynchronous data pipeline, according to other various embodiments. In FIG. 7E, time 2T has elapsed since the rising transitions from mousetrap element 702 were transmitted by stage 718 over "data$_{N+1}$" and "req$_{N+1}$" toward stage 720. Thus, the acknowledgment of the rising transitions by mousetrap element 706 has been received at stage 718 and forwarded by join control circuit 712 to mousetrap element 702. After the acknowledgment is received by mousetrap element 702, the latch controller in mousetrap element 702 opens the request and data latches in mousetrap element 702.

The phase signal "P$_{N+1}$" is also used to open the latches in mousetrap element 708 of stage 720. This allows the falling transitions received over "req$_{N+1}$" and "data$_{N+1}$" to be forwarded by fork control circuit 714 to the request latch and data latch in mousetrap element 708.

Figure 7F:
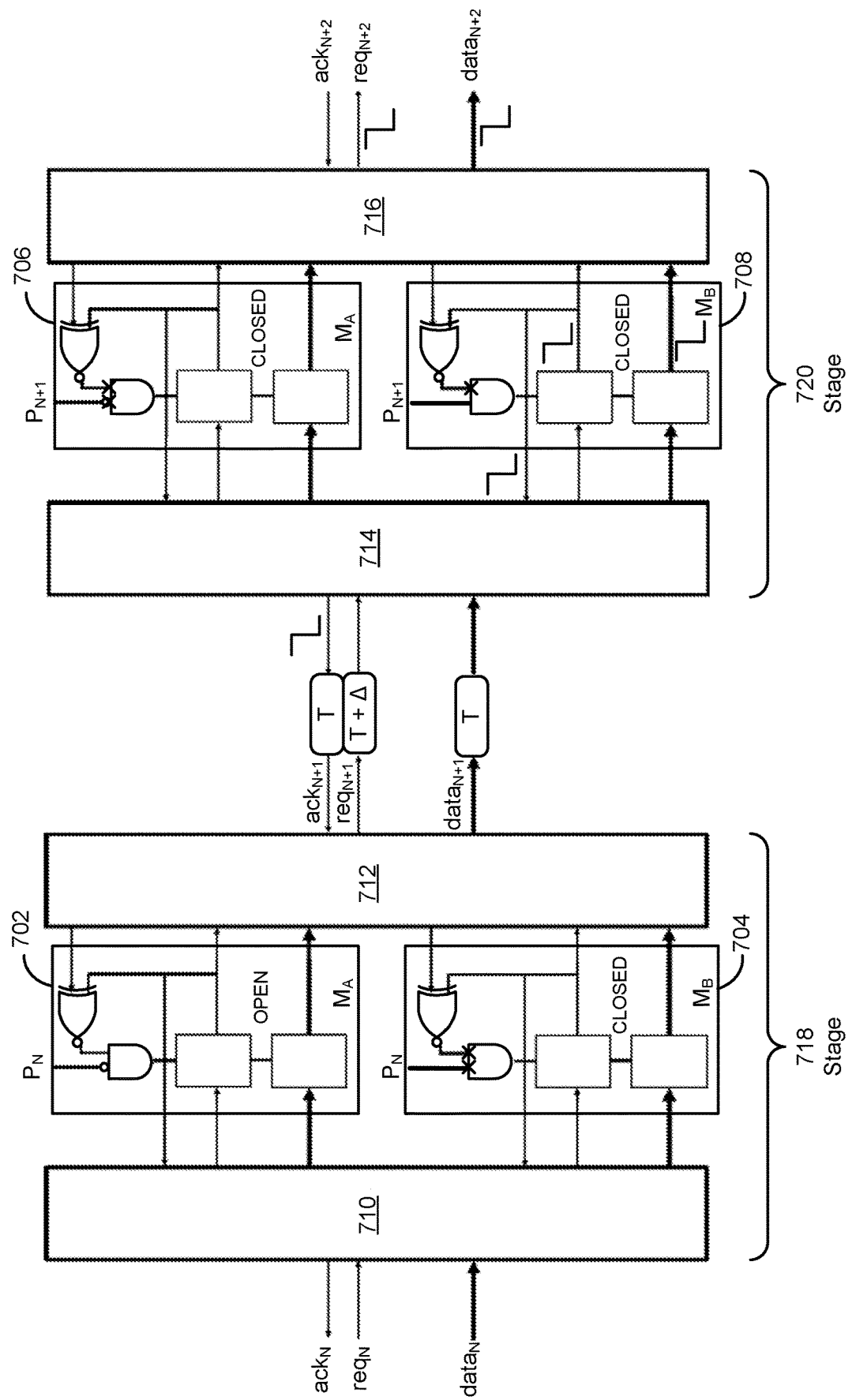
FIG. 7F illustrates an exemplar flow of data between two pipeline stages in an asynchronous data pipeline, according to other various embodiments.

FIG. 7F illustrates an exemplar flow of data between two pipeline stages 718-720 in an asynchronous data pipeline, according to other various embodiments. More specifically, FIG. 7F shows pipeline stages 718-720 after the falling transitions at the request and data latches in mousetrap element 708 have been forwarded by join control circuit 716 over "data$_{N+2}$" and "req$_{N+2}$" toward the pipeline stage after stage 720. In response to the falling transitions passing through the latches of mousetrap element 708, the phase signal "P$_{N+1}$" closes the latches in mousetrap element 708. An acknowledgment of the falling transitions is also generated by mousetrap element 708. This acknowledgment is passed by fork control circuit 714 over "ack$_{N+1}$" toward stage 718 while the falling transitions from mousetrap element 708 are transmitted over "data$_{N+2}$" and "req$_{N+2}$."

Figure 7G:
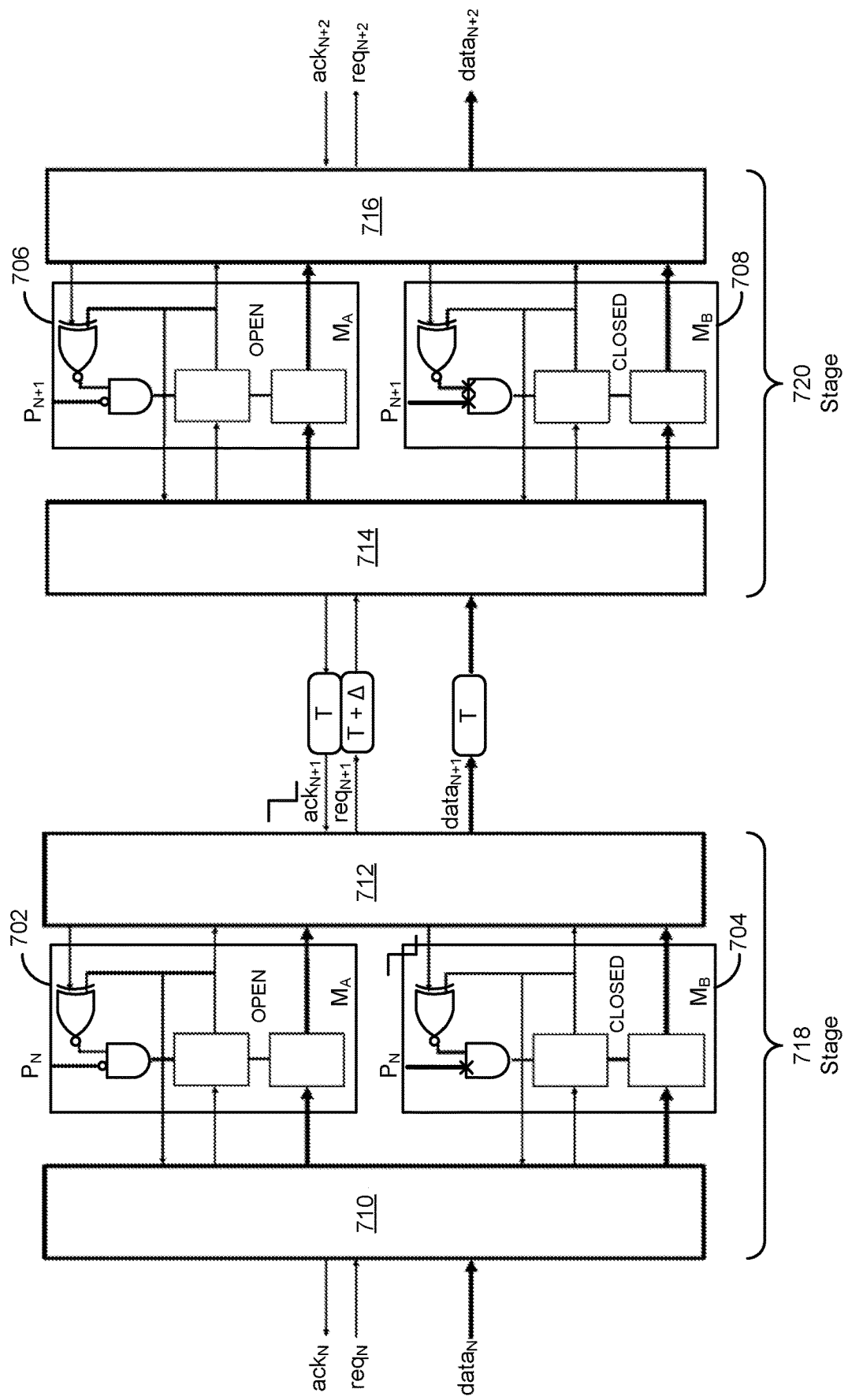
FIG. 7G illustrates an exemplar flow of data between two pipeline stages in an asynchronous data pipeline, according to yet other various embodiments.

FIG. 7G illustrates an exemplar flow of data between two pipeline stages 718-720 in an asynchronous data pipeline, according to yet other various embodiments. In FIG. 7G, time 3T has elapsed since the rising transitions from mousetrap element 702 were transmitted by stage 718 over "data$_{N+1}$" and "req$_{N+1}$" toward stage 720. As a result, the acknowledgment of the falling transitions by mousetrap element 708 has been received at stage 718 and forwarded by join control circuit 712 to mousetrap element 704. After the acknowledgment is received by mousetrap element 704, the latch controller in mousetrap element 704 opens the request and data latches in mousetrap element 704, thereby returning pipeline stages 718-720 to the same state as in FIG. 7A.

As mentioned above, pipeline stages of the asynchronous data pipeline can include more than two mousetrap elements. This increase in the number of mousetrap elements in each pipeline stage can further improve throughput and reduce latency in the asynchronous data pipeline. For example, each pipeline stage could include four mousetrap elements, each of which includes a request latch, a data latch, and a latch controller that includes an XNOR gate and an AND gate. Within the pipeline stage, fork control circuit 302 would include XOR gates and/or other components that perform a 1:4 fork, and join circuit would include XOR gates, multiplexers, and/or other components that perform a 4:1 join. The phase signal "P" could also be generated to rotate among the four mousetrap elements (e.g., in a round robin fashion) and transmit a new data element to the next pipeline stage with a delay of T/2, where T is the time required for data to reach the next pipeline stage. In this example, wave pipelining can be used to transmit up to two data elements over the data line at the same time. In general, the number of mousetrap elements in each pipeline stage of the asynchronous data pipeline can be increased until the decrease in spacing between transitions on the shared data, request, and/or acknowledgment lines between pipeline stages causes interference or overlap in signals from different mousetrap elements.

Figure 8:
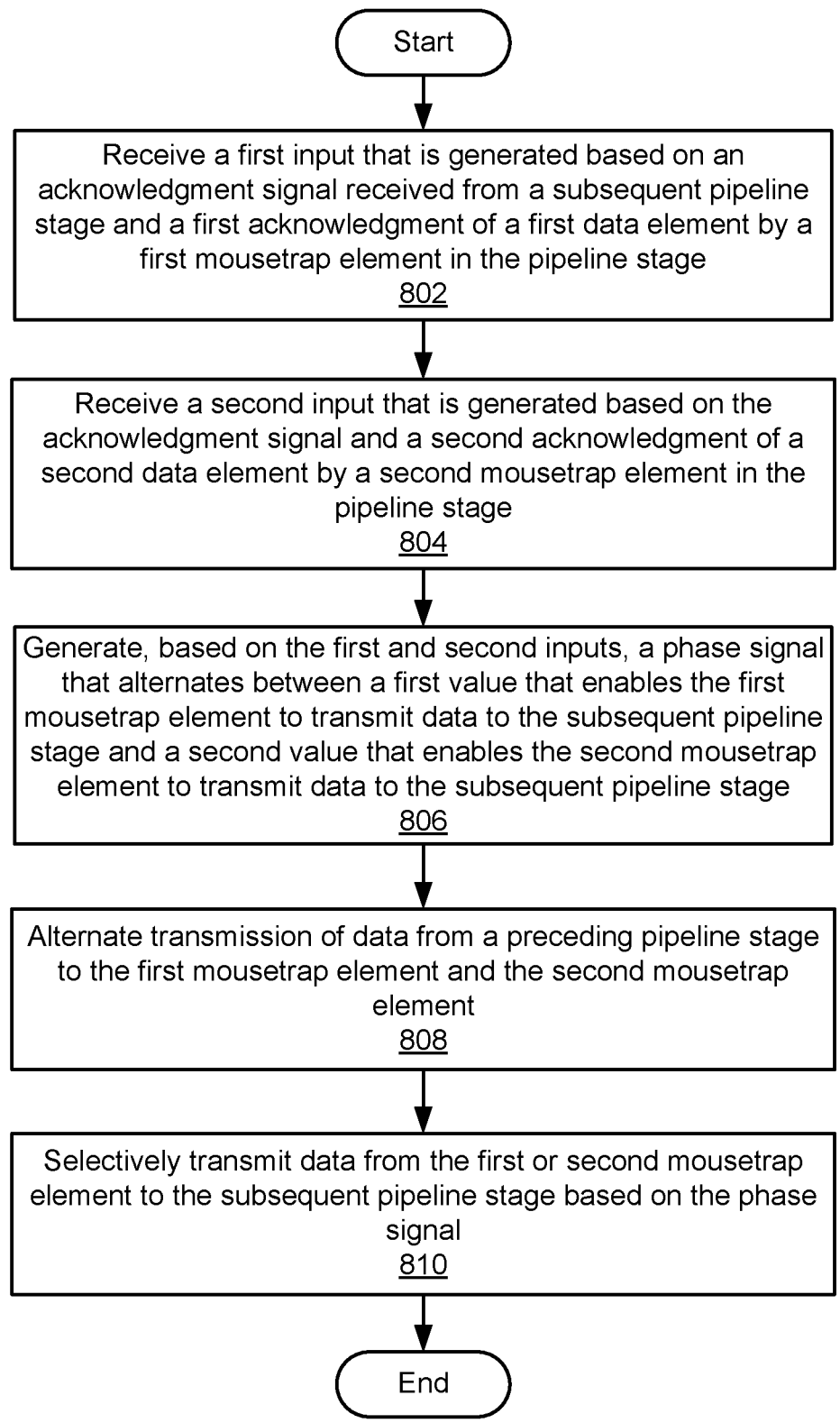
FIG. 8 is a flow diagram of method steps for transmitting data across pipeline stages included in an asynchronous data pipeline, according to various embodiments.

FIG. 8 is a flow diagram of method steps for transmitting data across pipeline stages included in an asynchronous data pipeline, according to various embodiments. Although the method steps are described in conjunction with the systems of FIGS. 1-6, persons skilled in the art will understand that any system configured to perform the method steps in any order falls within the scope of the present disclosure.

As shown, phase controller 400 receives 802 a first input that is generated based on an acknowledgment signal received from a subsequent pipeline stage and a first acknowledgment of a first data element by a first mousetrap element in the pipeline stage. For example, phase controller 400 could receive, as the first input, the output of an XNOR gate in a latch controller for the first mousetrap element. The XNOR output indicates whether or not a request signal from the first mousetrap element has been acknowledged by the next pipeline stage.

Next, phase controller 400 receives 804 a second input that is generated based on the acknowledgment signal and a second acknowledgment of a second data element by a second mousetrap element in the pipeline stage. For example, phase controller 400 could receive, as the second input, the output of an XNOR gate in a latch controller for the second mousetrap element. The XNOR output indicates whether or not a request signal from the second mousetrap element has been acknowledged by the next pipeline stage.

Phase controller 400 generates 806, based on the first and second inputs, a phase signal that alternates between a first value that enables the first mousetrap element to transmit data to the subsequent pipeline stage and a second value that enables the second mousetrap element to transmit data to the subsequent pipeline stage. For example, phase controller 400 could include a multiplexer that selects between the first and second inputs based on the current value of the phase signal. Phase controller 400 could also include a flip-flop and an inverter that generate the phase signal from the output of the multiplexer. Phase controller 400 could further include a delay element that inserts a delay between the end of the first value and the beginning of the second value and/or a delay between the end of the second value and the beginning of the first value. This delay prevents data elements from being transmitted too closely to one another over the same shared lines.

While phase controller 400 generates the phase signal, fork control circuit 302 alternates 808 transmission of data from a preceding pipeline stage to the first mousetrap element and the second mousetrap element. For example, fork control circuit 302 could generate separate request signals to the first and second mousetrap elements based on a request signal into the pipeline stage, so that when the request signal into the pipeline stage indicates that data has been transmitted to the pipeline stage, one request signal to one mousetrap element indicates that data is available for that mousetrap element and the other request signal to the other mousetrap element indicates that data is not available for that mousetrap element. Fork control circuit 302 could also duplicate a data signal received from the preceding pipeline stage into separate data signals to the first and second mousetrap elements. Fork control circuit 302 could additionally generate an acknowledgement signal that is transmitted to the preceding pipeline stage based on a first acknowledgement from the first mousetrap element and a second acknowledgement from the second mousetrap element.

Join control circuit 304 also selectively transmits 810 data from the first or second mousetrap element to the subsequent pipeline stage based on the phase signal. For example, join control circuit 304 could include a multiplexer that selects data from the first or second mousetrap element to forward to the subsequent pipeline stage based on the phase signal. Join control circuit 304 could also generate a first acknowledgment associated with a first data element that passes through the first mousetrap element to the subsequent pipeline stage and a second acknowledgment associated with a second data element that passes through the second mousetrap element to the subsequent pipeline stage based on an acknowledgment signal that is received from the subsequent pipeline stage.

In sum, the disclosed techniques provide a high-throughput asynchronous data pipeline that can be used to transport data across or between dies in a computing device. Within the asynchronous data pipeline, each pipeline stage can include two or more mousetrap elements that independently store and transmit data. Each mousetrap element includes a number of latches that, when enabled, allow a request signal and a data element to pass from the current pipeline stage that includes the mousetrap element to the next pipeline stage in the data pipeline. Each mousetrap element also includes a latch controller that enables and disables the request latch and the data latch based on a phase signal that alternates between a first value that configures the first mousetrap element to transmit data to the second pipeline stage and a second value that configures the second mousetrap element to transmit data to the second pipeline stage.

Each pipeline stage also includes a phase controller, which generates the phase signal that controls the operation of the mousetrap elements in the pipeline stage. The phase signal generated by the controller enables the latches in a selected mousetrap element at a given time and disables the latches in all remaining mousetrap elements within the same pipeline stage. To space out the transmission of data elements to the next pipeline stage, the phase signal optionally includes a delay between transmitting data from a first mousetrap element to the next pipeline stage and transmitting data from a second mousetrap element to the next pipeline stage.

Each pipeline stage additionally includes a fork control circuit that alternates transmission of data from a preceding pipeline stage to the mousetrap elements within a given pipeline stage, as well as a join control circuit that selectively transmits data from individual mousetrap elements in the pipeline stage to the next pipeline stage. The fork and join control circuits allow a single set of data, request, and acknowledgment wires between pipeline stages to be shared by mousetrap elements in the pipeline stages instead of duplicating the set of wires for each mousetrap element in a pipeline stage.

One technical advantage of the disclosed techniques relative to the prior art is that, with the disclosed techniques, a first stage in an asynchronous data pipeline is able to transmit a next data element to a second stage in the data pipeline before the first stage receives an acknowledgment from the second stage related to a previously transmitted data element. Accordingly, the disclosed techniques increase data throughput relative to conventional asynchronous pipelines, where a given stage in the pipeline has to wait for an acknowledgment from a subsequent stage in the pipeline related to the previously transmitted data element before transmitting the next data element to the subsequent pipeline stage. Another technical advantage is that the disclosed techniques, when implemented in an asynchronous data pipeline, reduce power consumption and latency relative to prior art solutions that attempt to place stages of the pipeline closer together, thereby requiring additional control handling. Yet another technical advantage is that the disclosed techniques, when implemented in an asynchronous data pipeline, reduce timing delays, power consumption, and die space relative to conventional synchronous data pipelines that require additional hardware and logic in order to transmit clock signals along with data across different pipeline stages. These technical advantages provide one or more technological improvements over prior art approaches.

1. In some embodiments, a data pipeline comprises a first mousetrap element and a second mousetrap element included in a first pipeline stage, wherein each of the first mousetrap element and the second mousetrap element comprises a request latch that, when enabled, allows a request signal to pass from the first pipeline stage to a second pipeline stage that follows the first pipeline stage in the data pipeline; a data latch that, when enabled, allows a data element to pass from the first pipeline stage to the second pipeline stage; and a latch controller that, in operation, enables and disables the request latch and the data latch based on a phase signal, wherein the phase signal alternates between a first value that enables the first mousetrap element to transmit data to the second pipeline stage and a second value that enables the second mousetrap element to transmit data to the second pipeline stage.
2. The data pipeline of clause 1, wherein the first pipeline stage further comprises a phase controller that generates the phase signal for input into the latch controller.
3. The data pipeline of clauses 1 or 2, wherein the phase controller alternates the phase signal between the first value and the second value when the request signal passes through the request latch.
4. The data pipeline of any of clauses 1-3, wherein the phase controller adds a first delay between an end of the first value and a beginning of the second value and a second delay between an end of the second value and a beginning of the first value.
5. The data pipeline of any of clauses 1-4, wherein the phase controller generates the phase signal by receiving a first input that is generated based on an acknowledgement signal from the second pipeline stage and a first acknowledgment of a first data element by the first mousetrap element, receiving a second input that is generated based on the acknowledgment signal and a second acknowledgment of a second data element by the second mousetrap element, and generating the phase signal based on the first input and the second input.
6. The data pipeline of any of clauses 1-5, wherein the phase controller generates the phase signal based on a first input and a second input, and wherein each of the first input and the second input is generated by an XNOR gate included in a corresponding mousetrap element.
7. The data pipeline of any of clauses 1-6, wherein the phase controller comprises a multiplexer that selects from a first input and a second input based on the phase signal, wherein the first input is generated based on a first set of acknowledgments of a first data element that passes through the first mousetrap element and the second input is generated based on a second set of acknowledgments of a second data element that passes through the second mousetrap element, and one or more components that switch the phase signal between the first value and the second value based on an output of the multiplexer.
8. The data pipeline of any of clauses 1-7, further comprising a fork control circuit that transmits data from a third pipeline stage alternately to the first mousetrap element and the second mousetrap element, wherein the third pipeline stage precedes the first pipeline stage.
9. The data pipeline of any of clauses 1-8, wherein the fork control circuit generates a first request signal that is transmitted to the first mousetrap element and a second request signal that is transmitted to the second mousetrap element, wherein the second request signal is a negation of the first request signal, and wherein the first request signal and the second request signal are generated based on a request signal received from the third pipeline stage.
10. The data pipeline of any of clauses 1-9, further comprising a fork control circuit that generates an acknowledgement signal that is transmitted to the third pipeline stage based on a first acknowledgement from the first mousetrap element and a second acknowledgement from the second mousetrap element.
11. The data pipeline of any of clauses 1-10, further comprising a join control circuit that selectively transmits data from the first mousetrap element and the second mousetrap element to the second pipeline stage.
12. The data pipeline of any of clauses 1-11, wherein the join control circuit generates a first acknowledgment associated with a first data element that passes through the first mousetrap element to the second pipeline stage and a second acknowledgment associated with a second data element that passes through the second mousetrap element to the second pipeline stage based on an acknowledgment signal that is received from the second pipeline stage.
13. The data pipeline of any of clauses 1-12, further comprising a multiplexer that transmits a first data element from the first mousetrap element or a second data element from the second mousetrap element to the second pipeline stage based on the phase signal.
14. In some embodiments, a computer-implemented method for transmitting data in a data pipeline comprises receiving a first input that is generated based on an acknowledgement signal received from a second pipeline stage that follows a first pipeline stage in the data pipeline and a first acknowledgment of a first data element by a first mousetrap element in the first pipeline stage, receiving a second input that is generated based on the acknowledgment signal and a second acknowledgment of a second data element by a second mousetrap element in the first pipeline stage, and generating, based on the first input and the second input, a phase signal that alternates between a first value that enables the first mousetrap element to transmit data to the second pipeline stage and a second value that enables the second mousetrap element to transmit data to the second pipeline stage.
15. The computer-implemented of clause 14, wherein generating the phase signal comprises adding a first delay between an end of the first value and a beginning of the second value, and adding a second delay between an end of the second value and a beginning of the first value.

16. The computer-implemented method of clauses 14 or 15, further comprising alternating transmission of data from a third pipeline stage that precedes the first pipeline stage to the first mousetrap element and the second mousetrap element.

17. The computer-implemented method of any of clauses 14-16, further comprising generating an acknowledgement signal that is transmitted to a third pipeline stage that precedes the first pipeline stage based on a first acknowledgement from the first mousetrap element and a second acknowledgement from the second mousetrap element.

18. The computer-implemented method of any of clauses 14-17, further comprising generating a first request signal that is transmitted to the first mousetrap element and a second request signal that is transmitted to the second mousetrap element, wherein the second request signal is a negation of the first request signal, and wherein the first request signal and the second request signal are generated based on a request signal received from the third pipeline stage.

19. The computer-implemented method of any of clauses 14-18, further comprising selectively transmitting the data from the first mousetrap element or the second mousetrap element to the second pipeline stage based on the phase signal.

20. The computer-implemented method of any of clauses 14-19, further comprising generating a first acknowledgment associated with a first data element that passes through the first mousetrap element to the second pipeline stage and a second acknowledgment associated with a second data element that passes through the second mousetrap element to the second pipeline stage based on an acknowledgment signal that is received from the second pipeline stage.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module," a "system," or a "computer." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A data pipeline, comprising:
a first mousetrap element and a second mousetrap element included in a first pipeline stage, wherein each of the first mousetrap element and the second mousetrap element comprises:

a request latch that, when enabled, allows a request signal to pass from the first pipeline stage to a second pipeline stage that follows the first pipeline stage in the data pipeline;

a data latch that, when enabled, allows a data element to pass from the first pipeline stage to the second pipeline stage; and a latch controller that, in operation, enables and disables the request latch and the data latch based on a phase signal, wherein the phase signal alternates between a first value that enables the first mousetrap element to transmit data to the second pipeline stage and a second value that enables the second mousetrap element to transmit data to the second pipeline stage.

2. The data pipeline of claim 1, wherein the first pipeline stage further comprises a phase controller that generates the phase signal for input into the latch controller.

3. The data pipeline of claim 2, wherein the phase controller alternates the phase signal between the first value and the second value when the request signal passes through the request latch.

4. The data pipeline of claim 2, wherein the phase controller adds a first delay between an end of the first value and a beginning of the second value and a second delay between an end of the second value and a beginning of the first value.

5. The data pipeline of claim 2, wherein the phase controller generates the phase signal by:

receiving a first input that is generated based on an acknowledgement signal from the second pipeline stage and a first acknowledgment of a first data element by the first mousetrap element;

receiving a second input that is generated based on the acknowledgment signal and a second acknowledgment of a second data element by the second mousetrap element; and generating the phase signal based on the first input and the second input.

6. The data pipeline of claim 2, wherein the phase controller generates the phase signal based on a first input and a second input, and wherein each of the first input and the second input is generated by an XNOR gate included in a corresponding mousetrap element.

7. The data pipeline of claim 2, wherein the phase controller comprises:

a multiplexer that selects from a first input and a second input based on the phase signal, wherein the first input is generated based on a first set of acknowledgments of a first data element that passes through the first mousetrap element and the second input is generated based on a second set of acknowledgments of a second data element that passes through the second mousetrap element; and one or more components that switch the phase signal between the first value and the second value based on an output of the multiplexer.

8. The data pipeline of claim 1, further comprising a fork control circuit that transmits data from a third pipeline stage alternately to the first mousetrap element and the second mousetrap element, wherein the third pipeline stage precedes the first pipeline stage.

9. The data pipeline of claim 8, wherein the fork control circuit generates a first request signal that is transmitted to the first mousetrap element and a second request signal that is transmitted to the second mousetrap element, wherein the second request signal is a negation of the first request signal, and wherein the first request signal and the second request signal are generated based on a request signal received from the third pipeline stage.

10. The data pipeline of claim 1, further comprising a fork control circuit that generates an acknowledgement signal that is transmitted to a third pipeline stage based on a first acknowledgement from the first mousetrap element and a second acknowledgement from the second mousetrap element.

11. The data pipeline of claim 1, further comprising a join control circuit that selectively transmits data from the first mousetrap element and the second mousetrap element to the second pipeline stage.

12. The data pipeline of claim 11, wherein the join control circuit generates a first acknowledgment associated with a first data element that passes through the first mousetrap element to the second pipeline stage and a second acknowledgment associated with a second data element that passes through the second mousetrap element to the second pipeline stage based on an acknowledgment signal that is received from the second pipeline stage.

13. The data pipeline of claim 1, further comprising a multiplexer that transmits a first data element from the first mousetrap element or a second data element from the second mousetrap element to the second pipeline stage based on the phase signal.

14. A computer-implemented method for transmitting data in a data pipeline, the method comprising:

receiving a first input that is generated based on an acknowledgement signal received from a second pipeline stage that follows a first pipeline stage in the data pipeline and a first acknowledgment of a first data element by a first mousetrap element in the first pipeline stage;

receiving a second input that is generated based on the acknowledgment signal and a second acknowledgment of a second data element by a second mousetrap element in the first pipeline stage; and generating, based on the first input and the second input, a phase signal that alternates between a first value that enables the first mousetrap element to transmit data to the second pipeline stage and a second value that enables the second mousetrap element to transmit data to the second pipeline stage.

15. The computer-implemented of claim 14, wherein generating the phase signal comprises:

adding a first delay between an end of the first value and a beginning of the second value; and adding a second delay between an end of the second value and a beginning of the first value.

16. The computer-implemented method of claim 14, further comprising alternating transmission of data from a third pipeline stage that precedes the first pipeline stage to the first mousetrap element and the second mousetrap element.

17. The computer-implemented method of claim 14, further comprising generating an acknowledgement signal that is transmitted to a third pipeline stage that precedes the first pipeline stage based on a first acknowledgement from the first mousetrap element and a second acknowledgement from the second mousetrap element.

18. The computer-implemented method of claim 14, further comprising generating a first request signal that is transmitted to the first mousetrap element and a second request signal that is transmitted to the second mousetrap element, wherein the second request signal is a negation of the first request signal, and wherein the first request signal and the second request signal are generated based on a request signal received from a third pipeline stage.

19. The computer-implemented method of claim 14, further comprising selectively transmitting the data from the first mousetrap element or the second mousetrap element to the second pipeline stage based on the phase signal.

20. The computer-implemented method of claim 14, further comprising generating a first acknowledgment associated with a first data element that passes through the first mousetrap element to the second pipeline stage and a second acknowledgment associated with a second data element that passes through the second mousetrap element to the second pipeline stage based on an acknowledgment signal that is received from the second pipeline stage.

\* \* \* \* \*